US012805378B2

(12) United States Patent
Hoya

(10) Patent No.: US 12,805,378 B2
(45) Date of Patent: Nov. 17, 2026

(54) SEMICONDUCTOR MODULE, AND MANUFACTURING METHOD FOR SEMICONDUCTOR MODULE

(71) Applicant: FUJI ELECTRIC CO., LTD., Kawasaki (JP)

(72) Inventor: Masashi Hoya, Shiojiri-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 356 days.

(21) Appl. No.: 18/308,445

(22) Filed: Apr. 27, 2023

(65) Prior Publication Data

US 2023/0420323 A1 Dec. 28, 2023

(30) Foreign Application Priority Data

Jun. 8, 2022 (JP) ................................ 2022-092791
Sep. 16, 2022 (JP) ................................ 2022-147730

(51) Int. Cl.
*H10W 74/10* (2026.01)
*H10W 70/40* (2026.01)
(Continued)

(52) U.S. Cl.
CPC ........ *H10W 74/127* (2026.01); *H10W 70/411* (2026.01); *H10W 70/481* (2026.01); *H10W 74/016* (2026.01); *H10W 90/753* (2026.01)

(58) Field of Classification Search
CPC ............. H10W 40/251; H10W 40/778; H10W 70/427; H10W 70/465; H10W 70/479;
(Continued)

(56) References Cited

U.S. PATENT DOCUMENTS

2011/0255281 A1* 10/2011 Takei .................. H10H 20/856 257/E33.072
2017/0323839 A1* 11/2017 Ariki .................. H01L 23/3737
(Continued)

FOREIGN PATENT DOCUMENTS

CN 113113315 A 7/2021
JP 63-211638 A 9/1988
(Continued)

OTHER PUBLICATIONS

Office Action dated Aug. 18, 2026 issued in Japanese Application No. 2022-147730.

*Primary Examiner* — Fazli Erdem

(57) ABSTRACT

A semiconductor module includes: a first die pad having a first face, and a second face directed in a direction opposite to the first face, a first outer lead positioned in the direction in which the second face is directed relative to the first die pad, a first inner lead connecting the first die pad and the first outer lead to each other and having a stepped portion, a first semiconductor chip joined to the second face, and a sealing material sealing the first die pad and the first semiconductor chip, in which the sealing material includes a first sealing portion joined to the first face and constituted of a first resin composition, and a second sealing portion joined to the second face and constituted of a second resin composition lower in thermal conductivity than the first resin composition, and the first sealing portion has an exposed face constituting a part of an outer surface of the sealing material, a first joining face joined to the first die pad, and a second joining face joined to the stepped portion along a height direction of the stepped portion.

15 Claims, 12 Drawing Sheets

(51) Int. Cl.
*H10W 74/01* (2026.01)
*H10W 90/00* (2026.01)

(58) Field of Classification Search
CPC ... H10W 74/111; H10W 90/00; H10W 90/811
See application file for complete search history.

(56) References Cited

U.S. PATENT DOCUMENTS

| | | | | |
|---|---|---|---|---|
| 2019/0057928 | A1* | 2/2019 | Kawashima | H01L 23/42 |
| 2021/0020551 | A1* | 1/2021 | Iwai | H01L 23/3107 |
| 2021/0287968 | A1 | 9/2021 | Tanaka | |
| 2022/0173007 | A1* | 6/2022 | Shirao | H01L 23/49551 |

FOREIGN PATENT DOCUMENTS

| | | | |
|---|---|---|---|
| JP | 1-208839 | A | 8/1989 |
| JP | 2000-138343 | A | 5/2000 |
| JP | 2002-16196 | A | 1/2002 |
| JP | 2009-302526 | A | 12/2009 |
| JP | 2018-29149 | A | 2/2018 |
| JP | 2019-181715 | A | 10/2019 |
| JP | 2021-145036 | A | 9/2021 |
| WO | 2017/138092 | A1 | 8/2017 |

* cited by examiner

SEMICONDUCTOR MODULE, AND MANUFACTURING METHOD FOR SEMICONDUCTOR MODULE

CROSS REFERENCE TO RELATED APPLICATIONS

This Application claims priority from (i) Japanese Patent Application No. 2022-092791, which was filed on Jun. 8, 2022, and (ii) Japanese Patent Application No. 2022-147730, which was filed on Sep. 16, 2022, the entire contents of each of which is incorporated herein by reference.

BACKGROUND OF THE INVENTION

Field of the Invention

This disclosure relates to semiconductor modules and a manufacturing method for a semiconductor module.

Description of Related Art

Known in the art, for example, WO 2017/138092 and Japanese Patent Application Laid-Open Publication Nos. 2021-145036, 2000-138343, 2018-29149, 2009-302526, and 2002-16196, is a semiconductor module exemplified by a power semiconductor module, in which a power semiconductor chip is mounted on a die pad made with a lead frame and is mold-sealed with a sealing resin.

For example, in WO 2017/138092, a sealing resin that seals a power semiconductor element joined to a die pad made with a lead frame includes a first sealing resin, and a second sealing resin containing a lower concentration of inorganic particles than the first sealing resin. The lead frame has a step to enable the die pad to be arranged on a lower side relative to an outer lead.

WO 2017/138092 describes that the first sealing resin is provided up to the upper surface of the die pad, without being provided at a location higher than the upper surface of the power semiconductor element, thereby mechanically fixing the first sealing resin to the side surface and the lower surface of the die pad due to an anchoring effect.

Since the contact range of the first sealing resin with the lead frame is limited to the side surface and the lower surface of the die pad in the configuration described in WO2017/138092, there is a problem in that efficiently dispersing heat from the power semiconductor element to the outside via the first sealing resin is difficult.

SUMMARY

In view of the above circumstances, one aspect of this disclosure is directed to improving the heat dissipation while reducing the cost of a semiconductor module.

In order to solve the above problems, a semiconductor module according to a preferred embodiment of this disclosure includes: a first die pad having a first face, and a second face directed in an direction opposite to the first face, a first outer lead positioned in the direction in which the second face is directed relative to the first die pad, a first inner lead connecting the first die pad and the first outer lead to each other and having a stepped portion, a first semiconductor chip joined to the second face, and a sealing material sealing the first die pad and the first semiconductor chip, in which the sealing material includes a first sealing portion joined to the first face and constituted of a first resin composition, and a second sealing portion joined to the second face and constituted of a second resin composition lower in thermal conductivity than the first resin composition, and the first sealing portion has an exposed face constituting a part of an outer surface of the sealing material, a first joining face joined to the first die pad, and a second joining face joined to the stepped portion along a height direction of the stepped portion.

A manufacturing method for a semiconductor module according to a preferred embodiment of this disclosure includes: a first die pad having a first face, and a second face directed in an direction opposite to the first face, a first outer lead positioned in the direction in which the second face is directed relative to the first die pad, a first inner lead connecting the first die pad and the first outer lead to each other and having a stepped portion, a first semiconductor chip joined to the second face, and a sealing material sealing the first die pad and the first semiconductor chip, the method including: preparing a lead frame including the first die pad, the first outer lead, and the first inner lead, forming, as a first forming step, a first sealing portion to be joined to the first face as a part of the sealing material using a first resin composition, and forming, as a second forming step, a second sealing portion to be joined to the second face as another part of the sealing material using a second resin composition lower in thermal conductivity than the first resin composition, in which the first sealing portion has an exposed face constituting a part of an outer surface of the sealing material, a first joining face joined to the first die pad, and a second joining face joined to the stepped portion along a height direction of the stepped portion.

DESCRIPTION OF EMBODIMENTS

Figure 1:
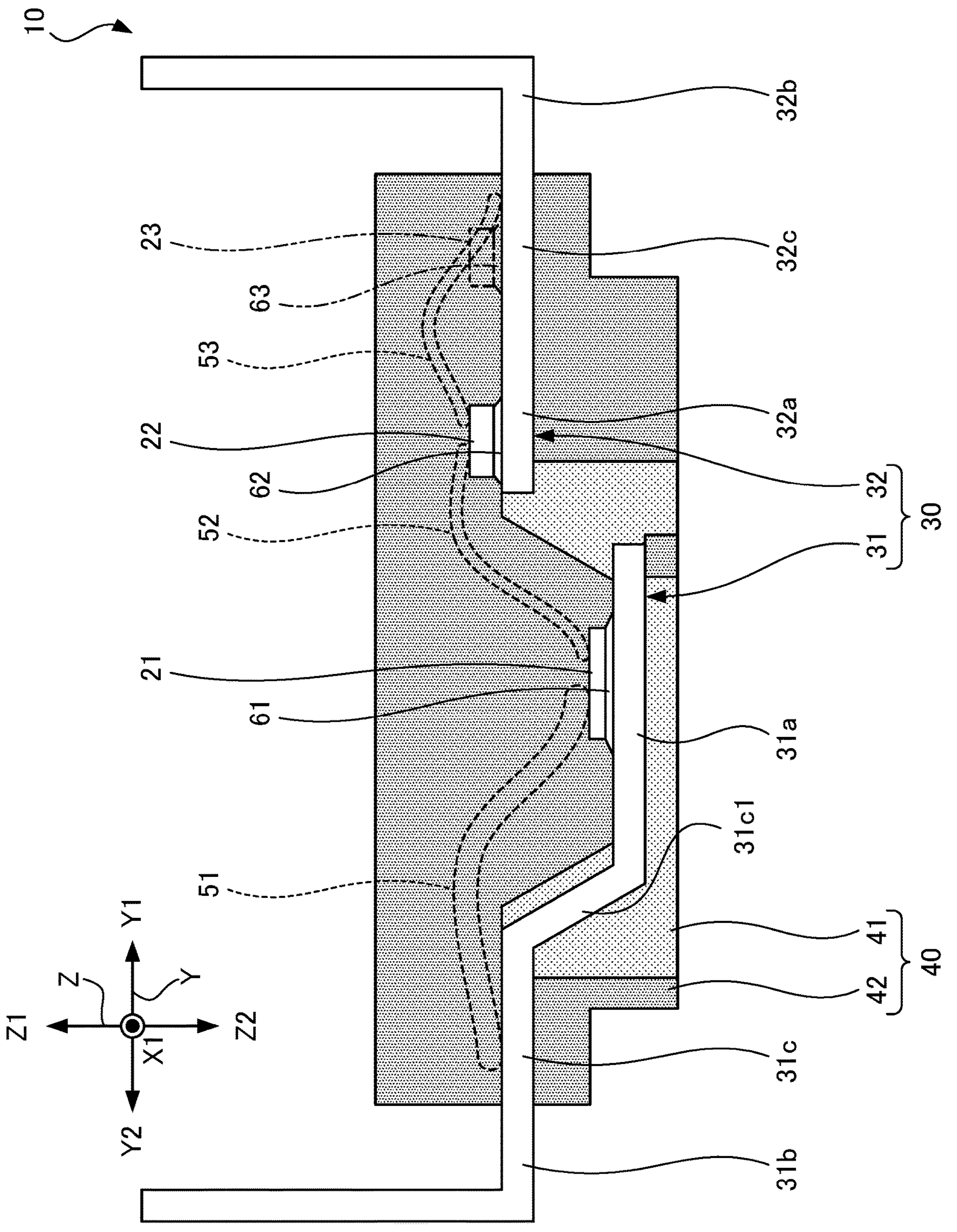
FIG. 1 is a sectional view of a semiconductor module according to a first embodiment.

Embodiments according to this disclosure are explained with reference to the drawings. The dimensions and the scales of parts in the drawings are different from actual products as appropriate. The embodiments described below are preferable specific examples of this disclosure. The following embodiments include various technically preferable limitations. However, the scope of this disclosure is not limited to the embodiments unless described in the following explanations that this disclosure is so specifically limited.

1. First Embodiment

1-1. Overall Configuration of Semiconductor Module

Figure 2:
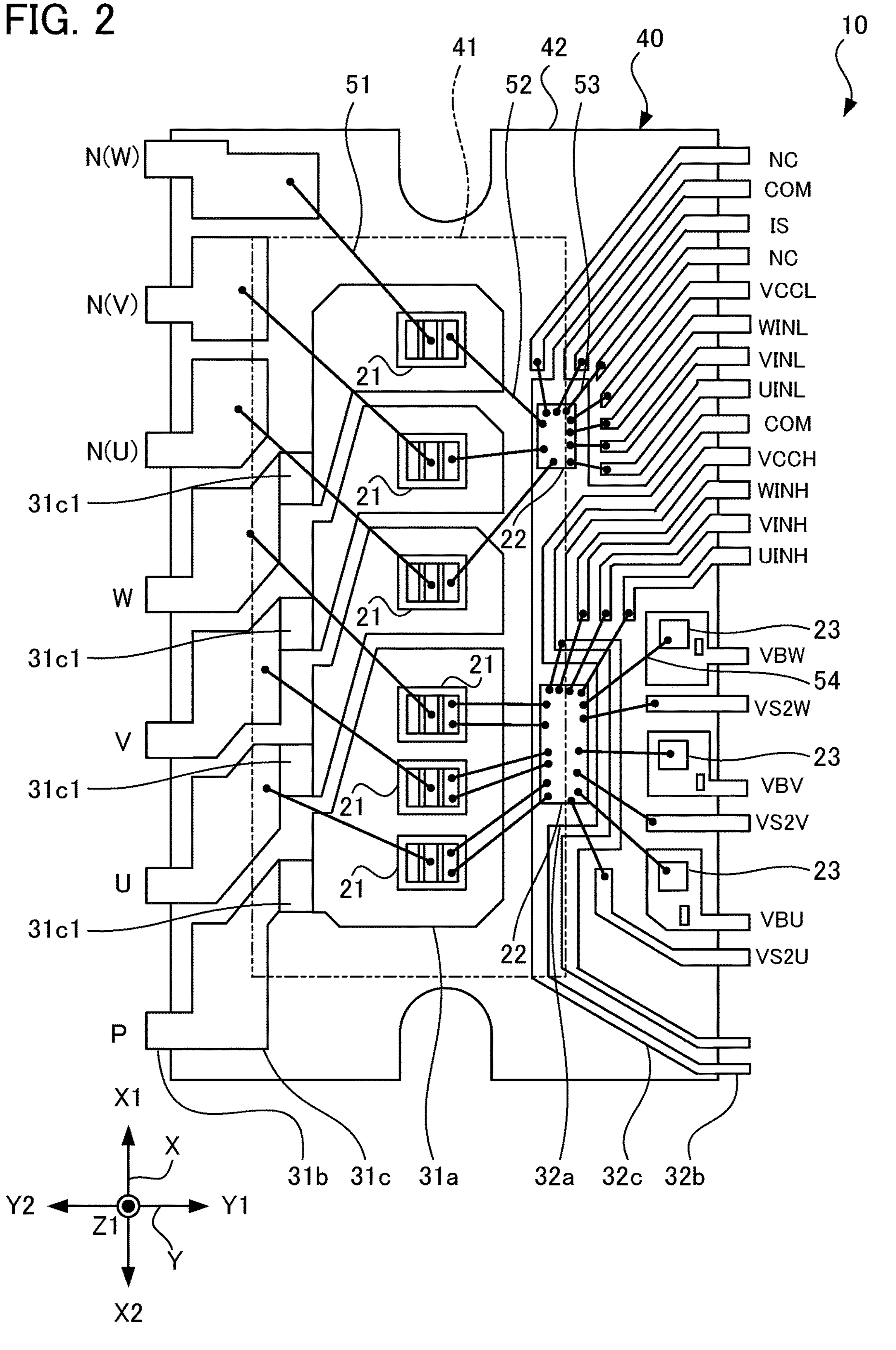
FIG. 2 is a plan view of the semiconductor module according to the first embodiment.

FIG. 1 is a sectional view of a semiconductor module 10 according to a first embodiment. FIG. 2 is a plan view of the semiconductor module 10 according to the first embodiment. The semiconductor module 10 is a power module such as an IGBT (Insulated Gate Bipolar Transistor) module. In an example illustrated in FIGS. 1 and 2, the semiconductor module 10 is an IPM (Intelligent Power Module) having an inverter bright circuit and a control circuit incorporated therein and is used for, for example, power control in a device such as an inverter or a rectifier mounted on equipment such as an air conditioner, a railroad vehicle, an automobile, or a household electric machine.

As illustrated in FIGS. 1 and 2, the semiconductor module 10 includes a plurality of first semiconductor chips 21, a plurality of second semiconductor chips 22, a plurality of semiconductor chips 23, a lead group 30, and a sealing material 40. In FIG. 2, only the outer edge of the sealing material 40 is illustrated for convenience of explanation.

Outlines of the components of the semiconductor module 10 are first sequentially explained below with reference to FIGS. 1 and 2. An X-axis, a Y-axis, and a Z-axis orthogonal to each other are properly used for the sake of convenience in the following explanations. The Z-axis is an axis parallel to the thickness direction of the semiconductor module 10. In the following explanations, one direction along the X-axis is an X1 direction and the direction opposite to the X1 direction is an X2 direction. One direction along the Y-axis is a Y1 direction and the direction opposite to the Y1 direction is a Y2 direction. One direction along the Z-axis is a Z1 direction and the direction opposite to the Z1 direction is a Z2 direction. Relations between these directions and the vertical direction are not limited to particular ones and can be any relationships. In the following descriptions, viewing in a direction along the Z-axis is sometimes referred to as "plan view."

The first semiconductor chip 21 is a semiconductor element including switching elements such as an IGBT (Insulated Gate Bipolar Transistor) or a power MOSFET (metal-oxide-semiconductor field-effect transistor). In the examples illustrated in FIGS. 1 and 2, the first semiconductor chip 21 is a switching element such as an RC (Reverse-Conducting)-IGBT, and further includes a diode such as an FWD (Flyback Diode).

A drain electrode or a collector electrode that acts as an input electrode of the switching element is provided on the rear surface of each of the first semiconductor chips 21. A cathode electrode that acts as an output electrode of the diode is also provided on the rear surface so as to be electrically connected to the input electrode. In addition, a source electrode or an emitter electrode that acts as an output electrode of the switching element and a gate electrode that acts as a control electrode are provided on the front surface of each of the first semiconductor chips 21. An anode electrode that acts as an input electrode of the diode is also provided on the front surface so as to be electrically connected to the output electrode.

In the example illustrated in FIG. 1, there are six first semiconductor chips 21. The six first semiconductor chips 21 constitute three half-bridge circuits of a U-phase, a V-phase, and a W-phase. The three lower first semiconductor chips 21 in FIG. 2 among the six first semiconductor chips 21 are elements on a high potential side and the three higher first semiconductor chips 21 in FIG. 2 are elements on a low potential.

The number of first semiconductor chips 21 is not limited to the example illustrated in FIG. 1 and there may be any number thereof. The diode such as an FWD may be provided as a separate component from each of the first semiconductor chips 21. In this case, for example, the output electrode of each of the first semiconductor chips 21 is electrically connected to the input electrode of the paired diode via a bonding wire.

Each of the second semiconductor chips 22 is an electronic component such as an IC (Integrated Circuit) for controlling driving of the first semiconductor chips 21. In the example illustrated in FIG. 2, the number of the second semiconductor chips 22 is two. The lower second semiconductor chip 22 in FIG. 2 out of the two second semiconductor chips 22 corresponds to the three first semiconductor chips 21 on the high potential side. The upper second semiconductor chip 22 in FIG. 2 corresponds to the three first semiconductor chips 21 on the low potential side. Each of the two second semiconductor chips 22 is electrically connected to the control electrodes of the corresponding three first semiconductor chips 21 via bonding wires 52, respectively, and controls driving of the corresponding three first semiconductor chips 21.

Each of the semiconductor chips 23 is a diode such as a BSD (Boot Strap Diode.) In the example illustrated in FIG. 2, the number of the semiconductor chips 23 is three and the three semiconductor chips 23 are electrically connected to the front surface of the second semiconductor chip 22 on the high potential side via bonding wires 54, respectively. Details of this connection will be explained later with reference to FIG. 3.

The lead group 30 is a set of plural leads for electrically connecting the first semiconductor chips 21, the second semiconductor chips 22, and the semiconductor chips 23 to a substrate (not shown) on which the semiconductor module 10 is mounted. The lead group 30 is constituted of, for example, a metal such as copper, copper alloy, aluminum, aluminum alloy, or iron alloy and is obtained by processing a lead frame.

The lead group 30 is divided into a first lead group 31 composed of a plurality of leads for power, and a second lead group 32 composed of a plurality of leads for control. The first lead group 31 and the second lead group 32 are arranged spaced apart from each other.

The first lead group 31 includes a plurality of first die pads 31*a*, a plurality of first outer leads 31*b*, and a plurality of first inner leads 31*c*.

Each of the first die pads 31*a* is arranged on the inside of the sealing material 40 and has at least one of the first semiconductor chips 21 mounted thereon. The first die pads 31*a* are arrayed with a space from each other in the directions along the X-axis. In the example illustrated in FIG. 2, the number of the first die pads 31*a* is four. The rear surfaces of the three first semiconductor chips 21 on the high potential side are joined to one first die pad 31*a* among the four first die pads 31*a* with a joining material 61 such as solder. The rear surface of each of the first semiconductor chips 21 on the low potential side is joined to a corresponding one of the remaining three first die pads 31*a* with the joining material 61 such as solder.

Each of the first outer leads 31*b* is arranged at a location in the Z1 direction relative to the first die pads 31*a* on the outside of the sealing material 40. In the example illustrated in FIG. 2, the number of the first outer leads 31*b* is seven. The seven first outer leads 31*b* are seven terminals including output terminals U, V, and W of the three half-bridge circuits described above, a positive DC terminal P, and negative DC terminals N(U), N(V), and N(W.)

Each of the first inner leads 31*c* is arranged on the inside of the sealing material 40. The first inner leads 31*c* are provided to correspond to the first outer leads 31*b*, respectively. In the example illustrated in FIG. 2, the number of the first inner leads 31*c* is seven. Each of the seven first inner leads 31*c* is configured integrally with the corresponding first outer lead 31*b*. Four first inner leads 31*c* corresponding to the output terminals U, V, and W and the positive DC terminal P among the seven first inner leads 31*c* are provided to correspond to the four first die pads 31*a*, respectively. Each of the four first inner leads 31*c* is configured integrally with the corresponding first die pad 31*a*.

As described above, the first outer leads 31*b* are at the locations in the Z1 direction relative to the first die pads 31*a*. To allow this arrangement of the first outer leads 31*b* and the first die pads 31*a*, each of the four first inner leads 31*c* corresponding to the four first die pads 31*a* among the first inner leads 31*c* includes a stepped portion 31*c*1.

The first inner leads 31*c* described above are properly connected to the front surfaces of the first semiconductor chips 21 with a plurality of bonding wires 51, respectively. Details of this connection will be explained later with reference to FIG. 3.

The second lead group 32 includes a plurality of second die pads 32*a*, a plurality of second outer leads 32*b*, and a plurality of second inner leads 32*c*.

Each of the second die pads 32*a* is arranged on the inside of the sealing material 40 and has the second semiconductor chip 22 or the semiconductor chip 23 mounted thereon. In the example illustrated in FIG. 2, the number of the second die pads 32*a* is five. The rear surface of each of the second semiconductor chips 22 is joined to a corresponding one of two second die pads 32*a* among the five second die pads 32*a* with a joining material 62 such as an insulating or conducting adhesive. The rear surface of each of the semiconductor chips 23 is joined to a corresponding one of the remaining three second die pads 32*a* with a joining material 63 such as a conducting adhesive. The two second die pads 32*a* are arrayed at locations adjacent to the first die pads 31*a* in the Y1 direction with a space from each other in the directions along the X-axis. The remaining three second die pads 32*a* are arrayed at locations adjacent to the outer edge of the sealing material 40 with a space from each other in the directions along the X-axis.

The second outer leads 32*b* are respectively arranged at locations in the same plane as that of the second die pads 32*a* on the outside of the sealing material 40. In the example illustrated in FIG. 2, the number of the second outer leads 32*b* is twenty-one. The 21 second outer leads 32*b* are twenty-one terminals including gate power terminals $V_{BU}$, $V_{BV}$, and $V_{BW}$, reference potential terminals $V_{S2U}$, $V_{S2V}$, and $V_{S2W}$, signal input terminals $U_{INH}$, $V_{INH}$, and $W_{INH}$, a signal power terminal $V_{CCH}$, two common terminals COM, signal input terminals $U_{INL}$, $V_{INL}$, and $W_{INL}$, a signal power terminal $V_{CCL}$, a current detection terminal IS, two NC terminals, and two dummy terminals. One of the two dummy terminals is electrically connected to the signal power terminal $V_{CCH}$ and the other dummy terminal is electrically connected to the common terminals COM.

The second inner leads 32*c* are respectively arranged at locations in the same plane as that of the second die pads 32*a* on the inside of the sealing material 40. The second inner leads 32*c* are provided to correspond to the second outer leads 32*b*, respectively. In the example illustrated in FIG. 2, the number of the second inner leads 32*c* is 21. Each of the 21 second inner leads 32*c* is configured integrally with the corresponding second outer lead 32*b*. Three second inner leads 32*c* among the 21 second inner leads 32*c*, corresponding to the two common terminals COM and one of the dummy terminals are configured integrally with the two second die pads 32*a* for the second semiconductor chips 22. Three second inner leads 32*c* among the 21 second inner leads 32*c*, corresponding to the gate power terminals $V_{BU}$, $V_{BV}$, and $V_{BW}$ are provided to correspond to the three second die pads 32*a* for the semiconductor chips 23 and are configured integrally with the corresponding second die pads 32*a*, respectively.

The second inner leads 32*c* described above are properly connected to the front surfaces of the second semiconductor chips 22 and the semiconductor chips 23 with bonding wires 53, respectively. Details of this connection will be explained later with reference to FIG. 3.

The sealing material 40 seals the first semiconductor chips 21, the second semiconductor chips 22, the semiconductor chips 23, and some of the lead group 30 other than the outer leads. A radiating member such as a radiating fin is joined to the rear surface of the sealing material 40 by screwing or the like (not shown). The radiating member disperses heat from the first semiconductor chips 21 to the outside.

The sealing material 40 includes a first sealing portion 41 and a second sealing portion 42. In the example illustrated in FIG. 1, the first sealing portion 41 constitutes a part of the sealing material 40, and the second sealing portion 42 constitutes a part of the sealing material 40 other than the first sealing portion 41. Each of the first sealing portion 41 and the second sealing portion 42 is constituted of a resin composition. However, the thermal conductivity of a first resin composition, which is the resin composition constituting the first sealing portion 41, is greater than that of a second resin composition, which is the resin composition constituting the second sealing portion 42. The first sealing portion 41 is joined to the lead group 30 near the first semiconductor chips 21. In addition, the first sealing portion 41 is provided on the rear surface of the sealing material 40 and the lead group 30 to constitute a part of the rear surface of the sealing material 40. Accordingly, heat from the first semiconductor chips 21 can be efficiently dispersed from the rear surface of the sealing material 40. Details of the first sealing portion 41 and the second sealing portion 42 will be explained later with reference to FIGS. 4 to 7.

1-2. Application Example of Semiconductor Module

Figure 3:
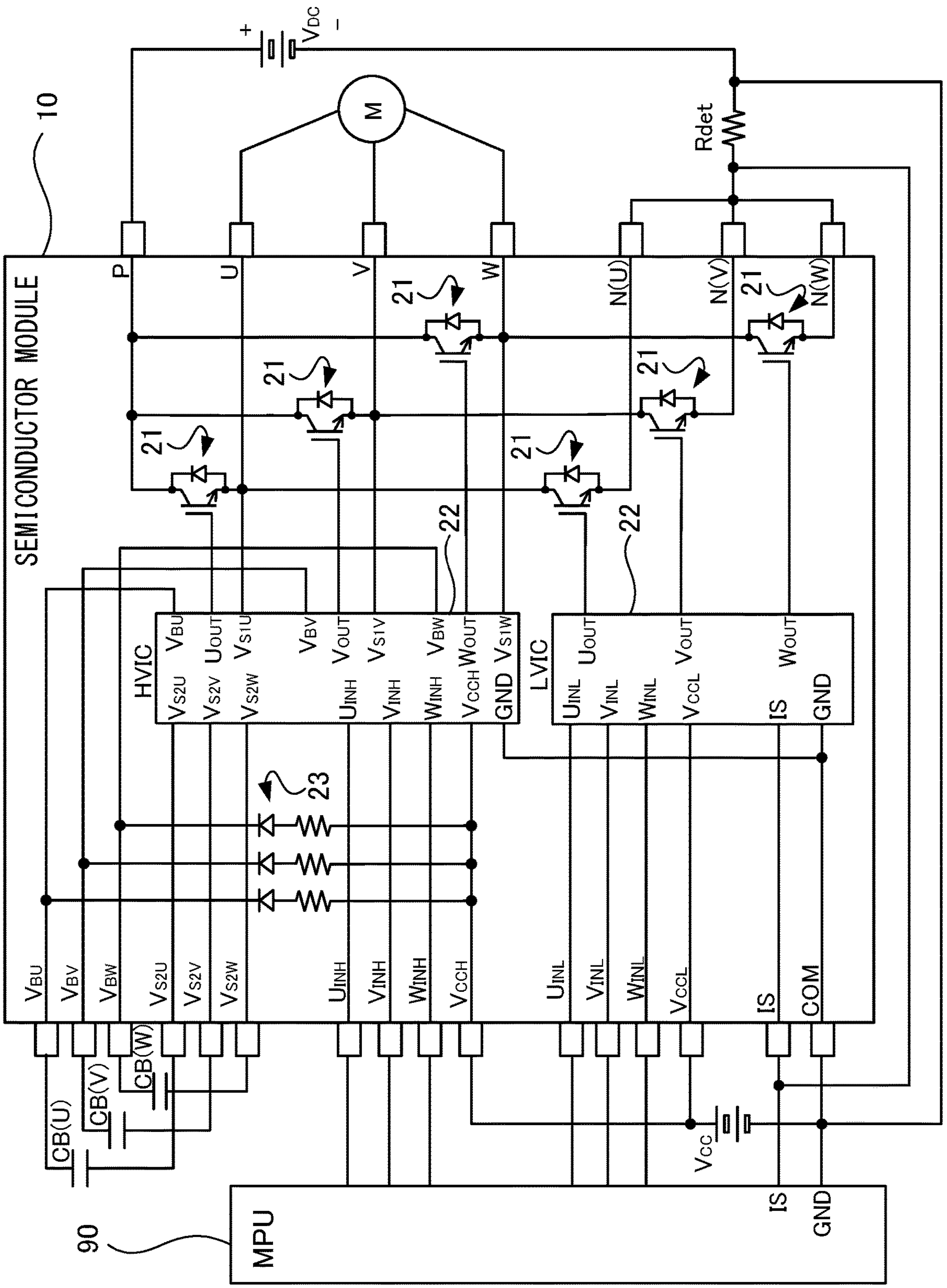
FIG. 3 is a diagram illustrating a circuit example in which the semiconductor module according to the first embodiment is applied to driving of a motor.

FIG. 3 is a diagram illustrating a circuit example in which the semiconductor module 10 according to the first embodiment is applied to driving of a motor M. In the example illustrated in FIG. 3, the motor M, a DC power source $V_{DC}$, a current detecting resistor Rdet, power supply capacitors CB(U), CB(V), and CB(W), a signal power source Vcc, and a controller 90 are connected to the semiconductor module 10.

The motor M is a three-phase motor and is connected to the output terminals U, V, and W of the three half-bridge circuits described above. The positive terminal of the DC power source $V_{DC}$ is connected to the positive DC terminal P of the three half-bridge circuits. The negative terminal of the DC power source $V_{DC}$ is connected to the negative DC terminals N(U), N(V), and N(W) of the three half-bridge circuits via the current detecting resistor Rdet. With this connection, the semiconductor module 10 supplies power to the motor M through the output terminals U, V, and W by receiving DC power from the DC power source Vic through the positive DC terminal P and the negative DC terminals N(U), N(V), and N(W.)

The power supply capacitors CB(U), CB(V), and CB(W) are used as gate-driving power sources for the switching elements of the three first semiconductor chips 21 on the high potential side. One terminal of a pair of terminals of the power supply capacitor CB(U) is connected to the gate power terminal $V_{BU}$, and the other terminal is connected to the reference potential terminal $V_{S2U}$. Similarly, one terminal of a pair of terminals of the power supply capacitor CB(V) is connected to the gate power terminal $V_{BV}$. The other terminal is connected to the reference potential terminal $V_{S2V}$. One terminal of a pair of terminals of the power supply capacitor CB(W) is connected to the gate power terminal $V_{BW}$. The other terminal is connected to the reference potential terminal $V_{S2W}$.

The positive terminal of the signal power source Vcc is connected to the signal power terminal $V_{CCH}$ and the signal power terminal $V_{CCL}$. The negative terminal of the signal power source Vcc is connected to the common terminal COM and a ground terminal (GND) of the controller 90. The signal power terminal $V_{CCH}$ is connected to the gate power terminals $V_{BU}$, $V_{BV}$, and $V_{BW}$ in an orientation where the anode is connected to the signal power terminal $V_{CCH}$ via the corresponding semiconductor chip 23 that is a BSD. The power supply capacitors CB(U), CB(V), and CB(W) are thereby charged with power from the signal power source Vcc.

The controller 90 is an integrated arithmetic unit (an MPU: Micro Processing Unit) for PWM (pulse width modulation) control. The controller 90 is connected to the signal input terminals $U_{INH}$, $V_{INH}$, and $W_{INH}$, the common terminal COM, the signal input terminals $U_{INL}$, $V_{INL}$, and $W_{INL}$, and the current detection terminal IS.

The controller 90 outputs a PWM signal to be input to the signal input terminals $U_{INH}$, $V_{INH}$, and $W_{INH}$ and the signal input terminals $U_{INL}$, $V_{INL}$, and $W_{INL}$. The PWM signal input to the signal input terminals $U_{INH}$, $V_{INH}$, and $W_{INH}$ is input to the second semiconductor chip 22 on the high potential side. The PWM signal input to the signal input terminals $U_{INL}$, $V_{INL}$, and $W_{INL}$ is input to the second semiconductor chip 22 on the low potential side. Each of the second semiconductor chips 22 outputs a signal for changing gate potentials of the switching elements of the corresponding three first semiconductor chips 21 from output terminals $U_{OUT}$, $V_{OUT}$, and $W_{OUT}$, respectively, on the basis of the input PWM signal. Accordingly, the switching elements of the first semiconductor chips 21 are switched between ON and OFF on the basis of the PWM signal from the controller 90.

The semiconductor module 10 detects a current flowing in each of the phases of the three half-bridge circuits on the basis of a resistance value of the current detecting resistor Rdet and protect the semiconductor module 10 from breaking at the time of occurrence of overcurrent. A current level signal depending on a change in the resistance value of the current detecting resistor Rdet is input to the second semiconductor chip 22 on the low potential side via the current detection terminal IS and is also input to the controller 90. The second semiconductor chip 22 on the low potential side determines whether overcurrent has occurred on the basis of a result of comparison between the current level signal and a reference value, and interrupts the current to the switching element of the second semiconductor chip 22 on the low potential side when overcurrent has occurred. The controller 90 determines whether overcurrent has occurred on the basis of a result of comparison between the current level signal and a reference value, and interrupts the current to the switching element of the second semiconductor chip 22 on the high potential side when overcurrent has occurred.

1-3. Sealing Material

Figure 4:
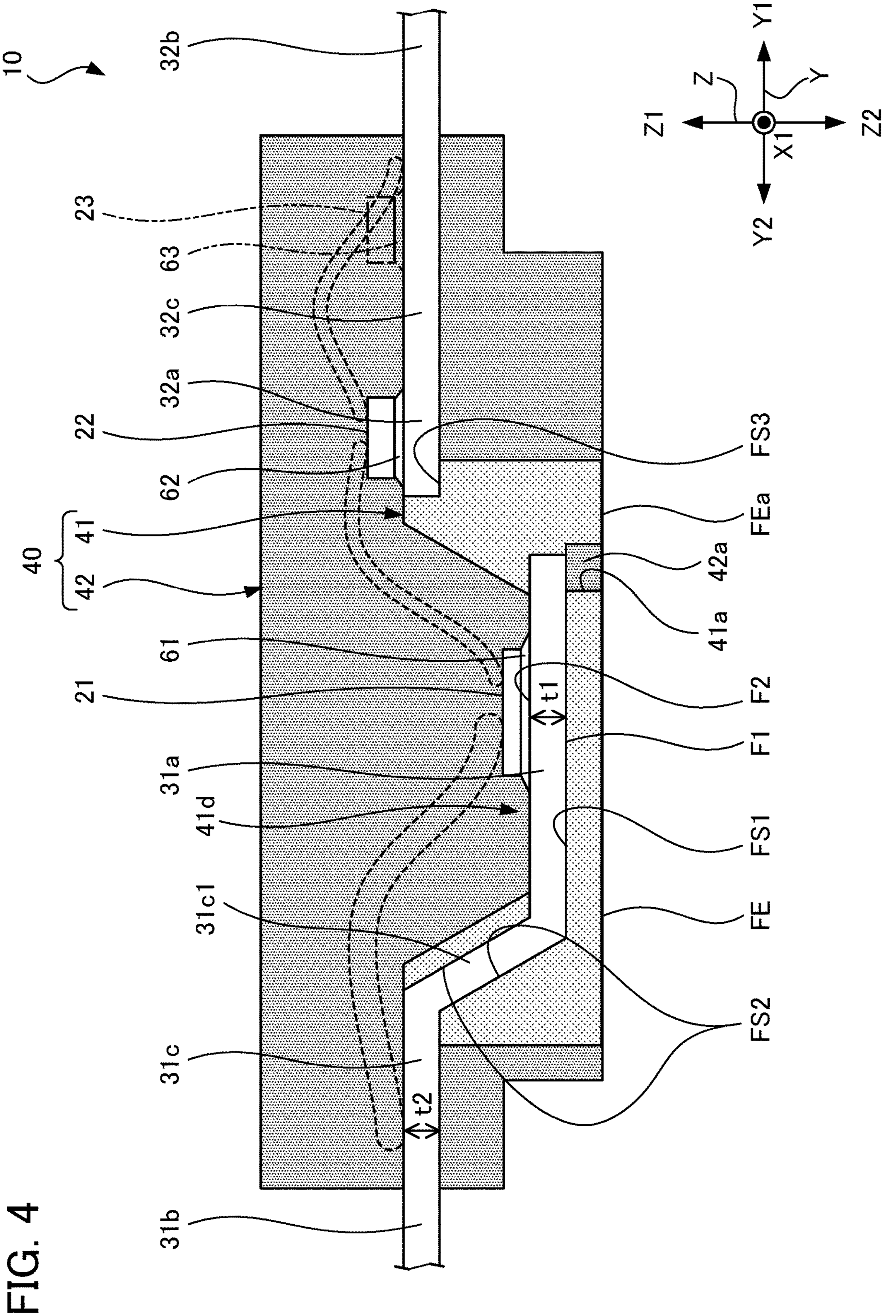
FIG. 4 is an enlarged sectional view of the semiconductor module according to the first embodiment.
Figure 5:
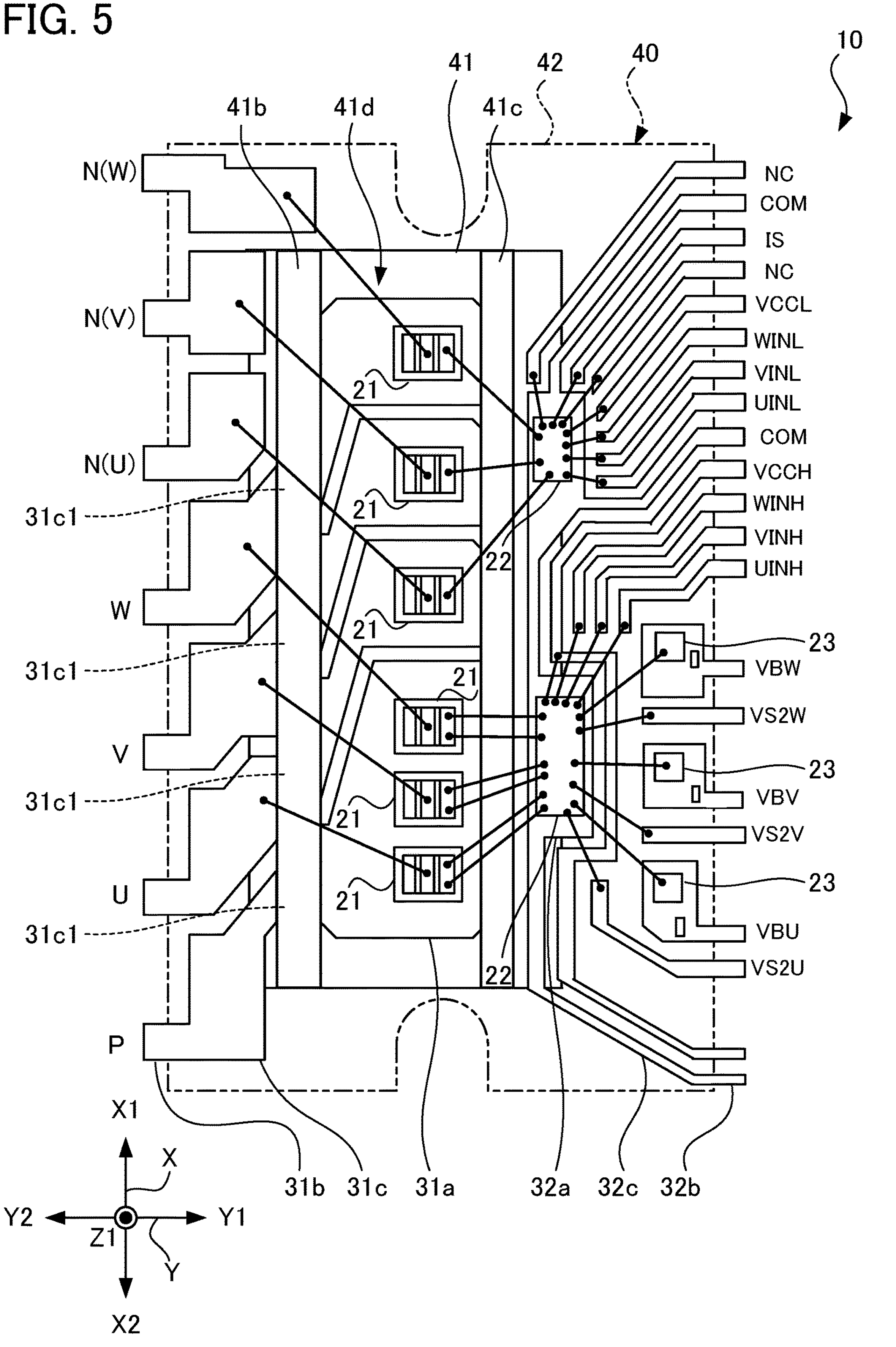
FIG. 5 is a diagram for explaining a shape of a first sealing portion in plan view.
Figure 6:
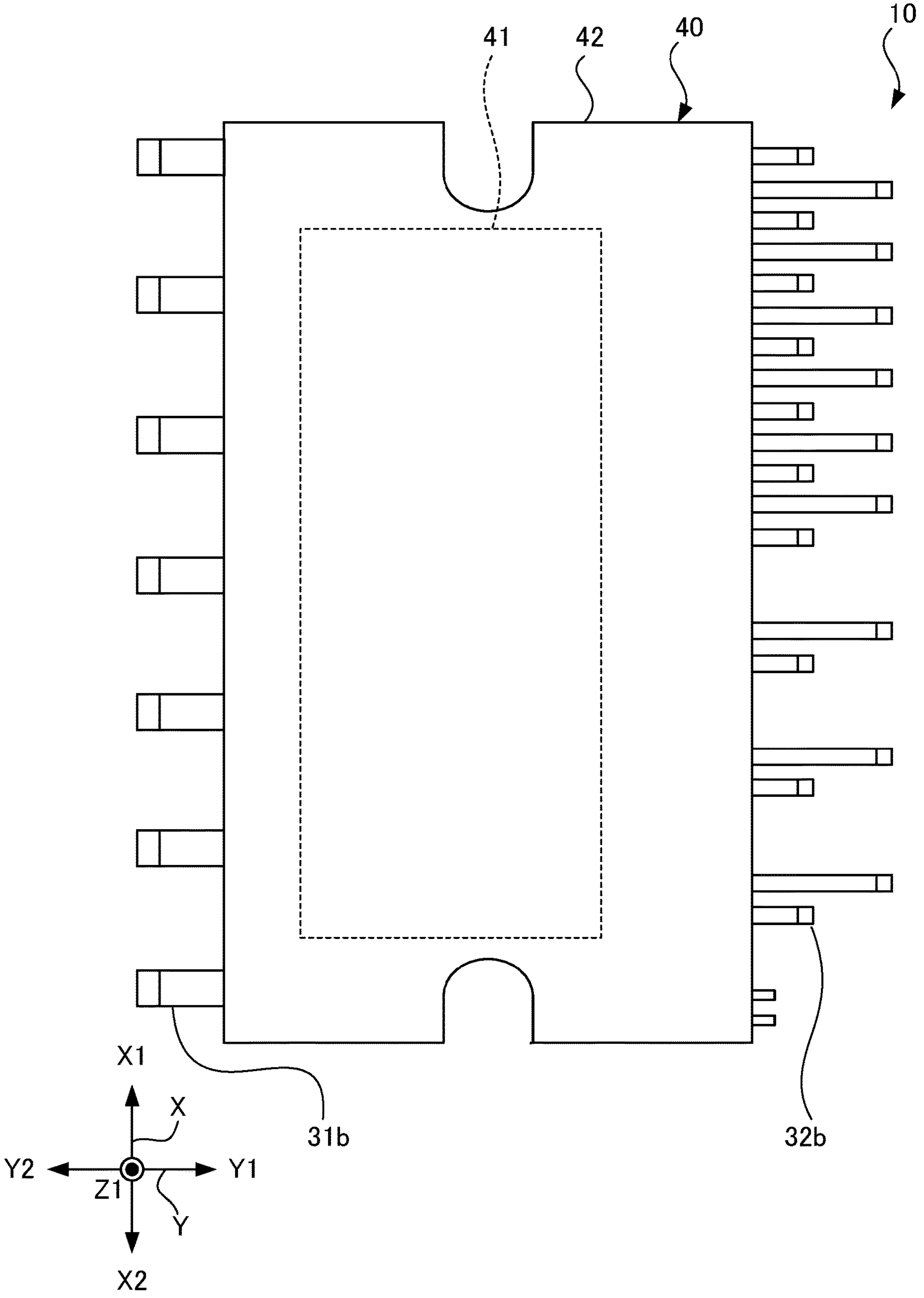
FIG. 6 is a top view of the semiconductor module according to the first embodiment.
Figure 7:
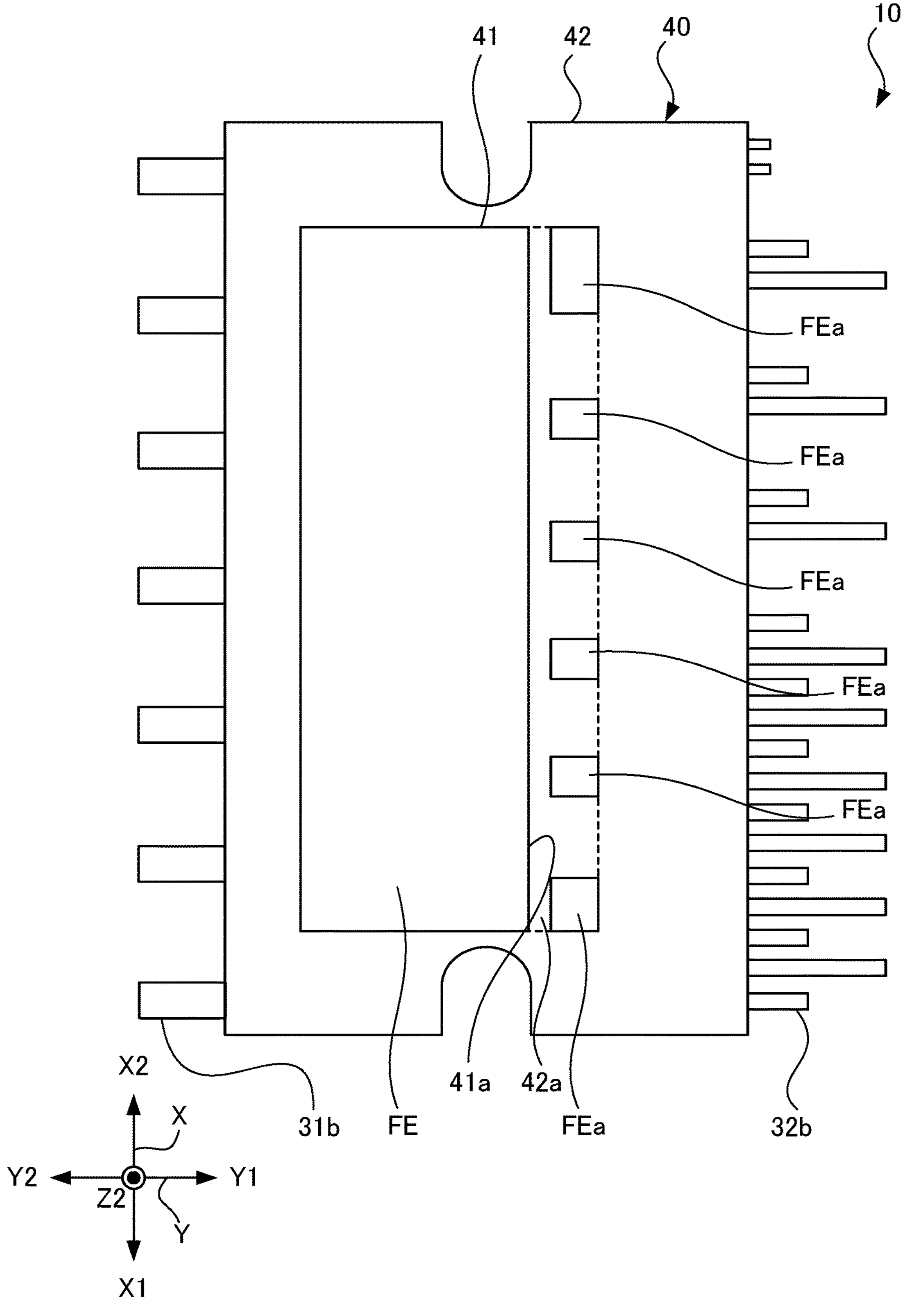
FIG. 7 is a bottom view of the semiconductor module according to the first embodiment.

FIG. 4 is an enlarged sectional view of the semiconductor module 10 according to the first embodiment. FIG. 5 is a diagram for explaining the shape of the first sealing portion 41 in plan view. FIG. 6 is a top view of the semiconductor module 10 according to the first embodiment. FIG. 7 is a bottom view of the semiconductor module 10 according to the first embodiment. FIG. 5 is a plan view of the semiconductor module 10 where illustration of the second sealing portion 42 is omitted. FIG. 6 is a diagram of the semiconductor module 10 when viewed in the Z2 direction. In contrast thereto, FIG. 7 is a diagram of the semiconductor module 10 when viewed in the Z1 direction.

Before explaining the sealing material 40, the first die pads 31*a*, the first outer leads 31*b*, the first inner leads 31*c*, the second die pads 32*a*, the second outer leads 32*b*, and the second inner leads 32*c* are first explained.

Each of the first die pads 31*a* has a first face F1, and a second face F2 directed in the direction opposite to the first face F1. In an example illustrated in FIG. 4, the first die pad 31*a* has a plate shape having the thickness direction in the directions along the Z-axis, the first face F1 is directed in the Z2 direction, and the second face F2 is directed in the Z1 direction. The first semiconductor chips 21 are joined on the second face F2 with the joining material 61.

The first outer leads 31*b* are positioned in the direction in which the second face F2 is directed relative to the first die pads 31*a*. That is, the first outer leads 31*b* are positioned in the Z1 direction relative to the first die pads 31*a*. The first outer leads 31*b* are positioned in the Y2 direction relative to the first die pads 31*a*. As a result, the first die pads 31*a* and the first outer leads 31*b* do not overlap with each other in plan view.

Each of the first inner leads 31*c* is configured integrally with the corresponding first die pad 31*a* and the corresponding first outer lead 31*b* and connects the first die pad 31*a* and the first outer lead 31*b* to each other. As described above, since the locations of the first die pad 31*a* and the first outer lead 31*b* in the directions along the Z-axis are different from each other, the first inner lead 31*c* has the stepped portion 31*c* 1 to allow this difference. In the example illustrated in FIG. 4, the stepped portions 31*c*1 extends in a direction inclined with respect to the Z-axis when viewed in the directions along the X-axis. A thickness t2 of the first inner leads 31*c* is equal to a thickness t1 of the first die pads 31*a*. The angle of this inclination is not limited to the example illustrated in FIG. 4. For example, the stepped portion 31*c*1 may extend in parallel to the Z-axis when viewed in the directions along the X-axis. The thickness t2 of the first inner leads 31*c* may be different from the thickness t1 of the first die pads 31*a*.

The second die pads 32*a* are positioned in the direction in which the second face F2 is directed relative to the first die pads 31*a*. In the example illustrated in FIG. 4, each of the second die pads 32*a* has a plate shape having the thickness direction in the directions along the Z-axis. The corresponding second semiconductor chip 22 is joined on a face of each of the second die pads 32*a* directed in the Z1 direction with the joining material 62, or the corresponding semiconductor chip 23 is joined thereon with the joining material 63.

Each of the second outer leads 32*b* has a part positioned in the same plane as that of the second die pads 32*a*. The second die pads 32*a* and the second outer leads 32*b* do not overlap in plan view.

Each of the second inner leads 32*c* is configured integrally with the corresponding second die pad 32*a* and the corresponding second outer lead 32*b* and connects the second die pad 32*a* and the second outer lead 32*b* to each other. The second inner leads 32*c* are positioned in the same plane as that of the second die pads 32*a*.

The first die pads 31*a*, the first inner leads 31*c*, the second die pads 32*a*, and the second inner leads 32*c* among the elements of the lead group 30 described above are sealed along with the first semiconductor chips 21, the second semiconductor chips 22, and the semiconductor chips 23 by the sealing material 40. As described above, the sealing material 40 includes the first sealing portion 41 and the second sealing portion 42.

The first sealing portion 41 is joined to a part of each of the first die pads 31*a*, the first inner leads 31*c*, and the second die pads 32*a*.

The first sealing portion 41 is provided in a range extending from a face of the sealing material 40 directed in the Z2 direction to each of the first die pads 31*a*, the first inner leads 31*c*, and the second die pads 32*a*. As a result, the first sealing portion 41 has an exposed face FE constituting a part of the outer surface of the sealing material 40, a first joining face FS1 joined to the first die pads 31*a*, a second joining face FS2 joined to the stepped portions 31*c*1 along the height direction of the stepped portions 31*c*1, and a third joining face FS3 joined to the second die pads 32*a*.

The exposed face FE is a face of the first sealing portion 41 constituting a part of the outer surface of the sealing material 40. In the example illustrated in FIG. 4, the exposed face FE is a face of the first sealing portion 41 directed in the Z2 direction and is positioned in the same plane as that of the face of the sealing material 40 directed in the Z2 direction.

The exposed face FE is positioned in the Z2 direction relative to the first die pads 31*a* and the first sealing portion 41 has a part interposed between the exposed face FE and the first face F1. This part acts to electrically insulate the radiating member such as the radiating fin joined to the face of the sealing material 40 directed in the Z2 direction from the first die pads 31*a*.

The first sealing portion 41 has a notch part 41*a* extending from the exposed face FE to the first face F1 as illustrated in FIG. 4. The notch part 41*a* is formed by protrusions 111*a* of a first forming mold 100 used at a first forming step S2 described later. As will be described later, the protrusions 111*a* position the first die pads 31*a* in the height direction at the first forming step S2.

As illustrated in FIG. 7, the notch part 41*a* has a shape open to the side surface of the first sealing portion 41. A part of the second sealing portion 42 can be filled in the notch part 41*a* at a second forming step S5 described later. In association with formation of this notch part 41*a*, the exposed face FE has a plurality of island parts FEa. In an example illustrated in FIG. 7, the shape of each of the parts FEa in plan view is a rectangle. The shape of each of the parts FEa in plan view is not limited to the example illustrated in FIG. 7 and may be, for example, a circle or an ellipse or may alternatively be a polygon other than a rectangle. The number of the parts FEa is not limited to the example illustrated in FIG. 7 and can be any number.

The first joining face FS1 is a face of the first sealing portion 41 joined to the first die pads 31*a*. In the example illustrated in FIG. 4, the first joining face FS1 is joined to the side surfaces of the first die pads 31*a* and the first faces F1. The first sealing portion 41 includes a concave part 41*d* open in the Z1 direction. The second face F2 is exposed on the bottom part of the concave part 41*d*. As a result, the second face F2 has a part not joined to the first joining face FS1. That is, the second face F2 has a part not joined to the first sealing portion 41. The first sealing portion 41 may not be joined to the entire second face F2.

As illustrated in FIG. 5, the first sealing portion 41 has a pair of walls 41*b* and 41*c* constituting the wall surface of the concave part 41*d*. The wall 41*b* is positioned in the Z1 direction relative to the stepped portions 31*c*1 and extends in the directions along the X-axis to cover ends of the first die pads 31*a* in the Y2 direction and the stepped portions 31*c*1. The wall 41*c* extends in the directions along the X-axis to cover ends of the first die pads 31*a* in the Y1 direction.

The second joining face FS2 is a face of the first sealing portion 41 joined to the stepped portions 31*c*1 along the height direction of the stepped portions 31*c*1. In the example illustrated in FIG. 4, an end face of the first sealing portion 41 in the Z1 direction is positioned in the same plane as that of ends of the stepped portions 31*c*1 in the Z1 direction. The second joining face FS2 covers the entirety of the surfaces of the stepped portions 31*c*1. As a result, the second joining face FS2 is joined to the stepped portions 31*c*1 entirely in the height direction of the stepped portions 31*c*1. The second joining face FS2 is also joined to the stepped portions 31*c*1 entirely in the circumferential direction of the stepped portions 31*c*1. The first sealing portion 41 may not be joined to a part of the stepped portions 31*c*1 in the circumferential direction or may not be joined to a part of the stepped portions 31*c*1 in the height direction.

The end face of the first sealing portion 41 in the Z1 direction is positioned in the same plane as that of faces of the first inner leads 31*c* directed in the Z1 direction. For this reason, steps or concave parts formed between the first sealing portion 41 and the first inner leads 31*c* can be reduced. As a result, formability at the second forming step S5 described later can be enhanced.

The third joining face FS3 is a face of the first sealing portion 41 joined to the second die pads 32*a*. In the example illustrated in FIG. 4, the third joining face FS3 is joined to a part of a face of each of the second die pads 32*a* directed in the Z2 direction and a part of the side surface of the second die pad 32*a*. The end face of the first sealing portion 41 in the Z1 direction is positioned in the same plane as the faces of the second die pads 32*a* directed in the Z1 direction. For this reason, steps or concave parts formed between the first sealing portion 41 and the second die pads 32*a* can be reduced. As a result, the formability at the second forming step S5 described later can be enhanced. The third joining face FS3 may be joined to the second inner leads 32*c*.

The second sealing portion 42 is provided to cover faces of the first sealing portion 41 other than the exposed face FE. As illustrated in FIG. 4, the second sealing portion 42 is joined to the second face F2 at the bottom part of the concave part 41*d* described above. The second sealing portion 42 has a part 42*a* filled in the notch part 41*a*. As illustrated in FIGS. 4, 6, and 7, the second sealing portion 42 constitutes the entire area of the outer surface of the sealing material 40 other than the exposed face FE.

The first sealing portion 41 and the second sealing portion 42 arranged as described above are constituted of resin compositions different from each other. Specifically, the first sealing portion 41 is constituted of a first resin composition, whereas the second sealing portion 42 is constituted of a second resin composition lower in the thermal conductivity than the first resin composition.

It is sufficient for the thermal conductivity of the first resin composition to be greater than that of the second resin composition. Specifically, the thermal conductivity of the first resin composition is preferably equal to or greater than 2 [W/K·m] and is more preferably equal to or greater than 3 [W/K·m] with the objective of increasing the thermal conductance although that is not particularly limited thereto.

It is sufficient for the thermal conductivity of the second resin composition to less than that of the first resin composition. Specifically, the thermal conductivity of the second resin composition is preferably equal to or less than 1 [W/K·m] with the objective of cost reduction and formability although that is not particularly limited thereto.

A difference in the thermal conductivity between the first resin composition and the second resin composition is preferably not less than 1 [W/K·m] and not greater than 3 [W/K·m] with the objective of achieving both an increase in the thermal conductance, and the cost reduction and the formability, although that is not particularly limited thereto.

Each of the first resin composition and the second resin composition is a composition including a resin such as a thermosetting resin, for example, an epoxy resin. The type of resin used for the first resin composition can be the same as, or be different from, that of the resin used for the second resin composition.

It is preferable that each of the first resin composition and the second resin composition contain an inorganic filler with the objective of increasing the thermal conductance. For example, insulating fillers such as silica ($SiO_2$), alumina ($Al_2O_3$), boron nitride (BN), magnesium oxide (MgO), magnesium carbonate ($MgCO_3$), silicon nitride ($Si_3N_4$), and aluminum nitride are cited as the inorganic filler. One type of these inorganic fillers can be used alone, or two or more types may be combined. As necessary, surface treatment such as coupling treatment is performed on the surface of the inorganic filler.

The content rate of inorganic filler in the first resin composition is preferably greater than that of the inorganic filler in the second resin composition. This enables the thermal conductivity of the first resin composition to be easily enhanced relative to that of the second resin composition.

Figure 8:
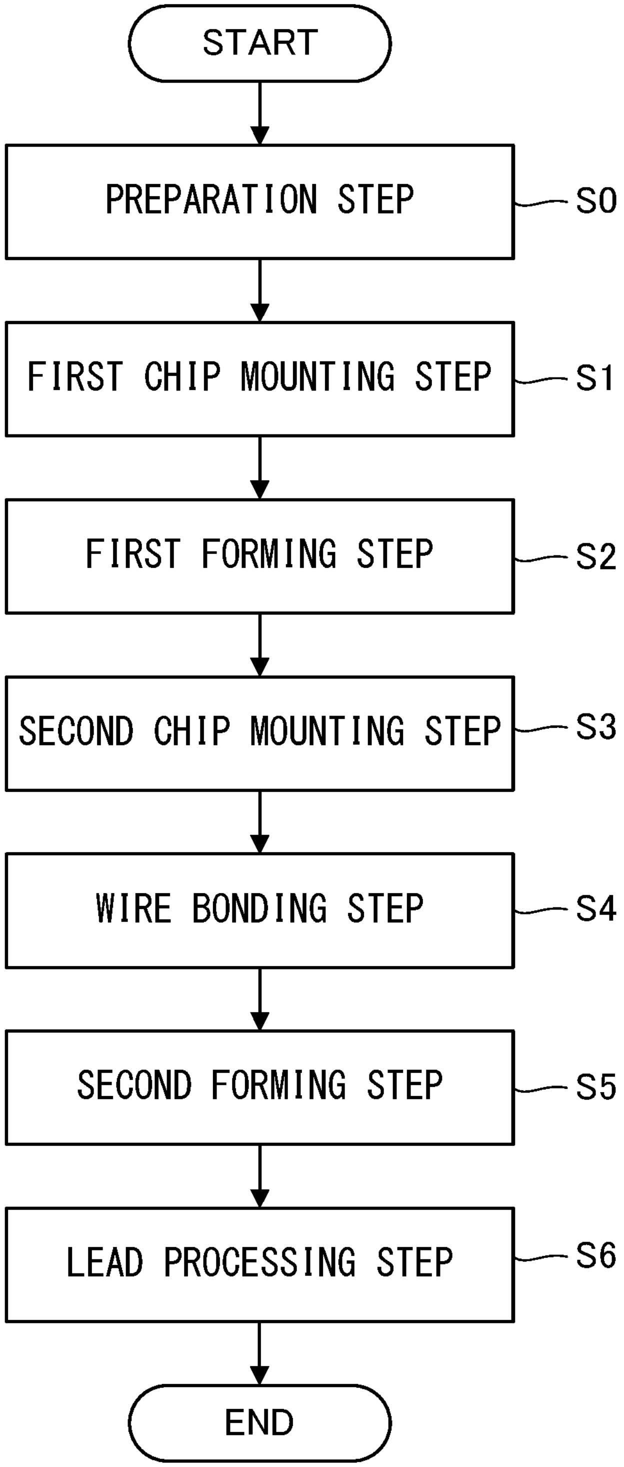
FIG. 8 is a flowchart illustrating a manufacturing method for the semiconductor module according to the first embodiment.

The type of inorganic filler used in the first resin composition can be the same as, or be different from, the type of inorganic filler used in the second resin composition. When the type of inorganic filler used in the first resin composition is different from that of the inorganic filler used in the second resin composition, the thermal conductivity of the inorganic filler used in the first resin composition is preferably greater than that of the inorganic filler used in the second resin composition. This enables the thermal conductivity of the first resin composition to be greater than that of the second resin composition while decreasing the difference in the content rate of the inorganic filler between the first resin composition and the second resin 1-4. Manufacturing Method for Semiconductor Module FIG. 8 is a flowchart illustrating a manufacturing method for the semiconductor module 10 according to the first embodiment. The manufacturing method for the semiconductor module 10 includes a preparation step S0, a first chip mounting step S1, the first forming step S2, a second chip mounting step S3, a wire bonding step S4, the second forming step S5, and a lead processing step S6 in this order as illustrated in FIG. 8. These steps are sequentially explained below.

1-4-0. Preparation Step

Figure 9:
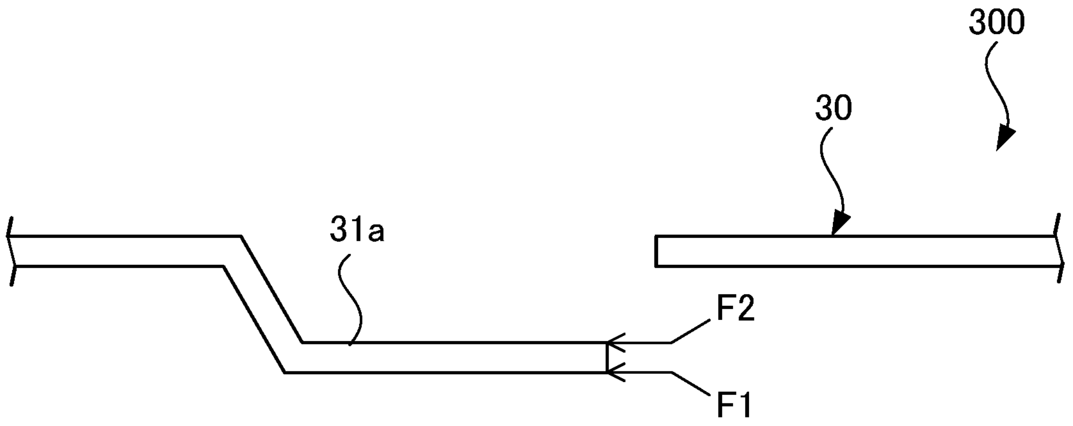
FIG. 9 is a diagram illustrating a preparation step.

FIG. 9 is a diagram illustrating the preparation step S0. At the preparation step S0, a lead frame 300 including the lead group 30 is prepared as illustrated in FIG. 9. The lead frame 300 includes a frame portion surrounding the lead group 30, and a tie bar connecting the lead group 30 and the frame portion to each other (not shown) in addition to the lead group 30.

1-4-1. First Chip Mounting Step

Figure 10:
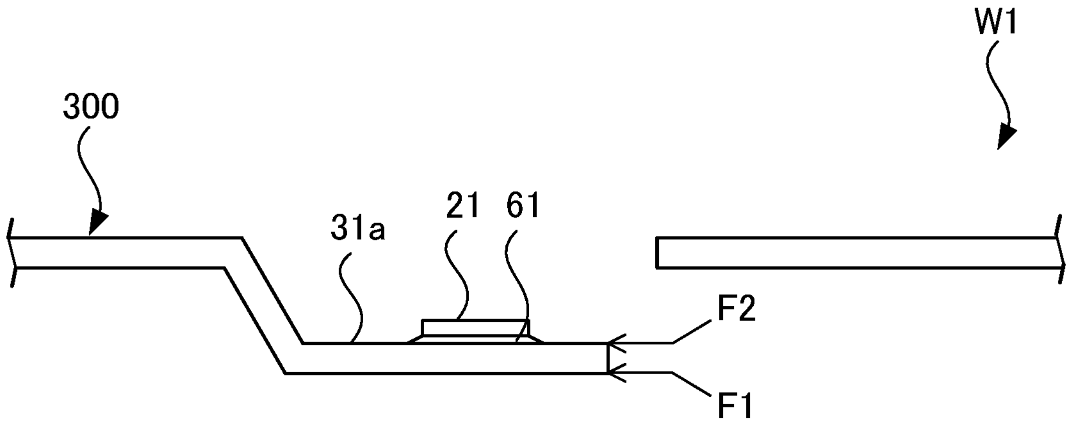
FIG. 10 is a diagram illustrating a first semiconductor chip mounting step.

FIG. 10 is a diagram illustrating the first chip mounting step S1. At the first chip mounting step S1, the lead frame 300 including the lead group is prepared. The first semiconductor chips 21 are joined to the second faces F2 of the corresponding first die pads 31*a* with the joining material 61 as illustrated FIG. 10. A workpiece W1 is thereby obtained.

1-4-2. First Forming Step

Figure 11:
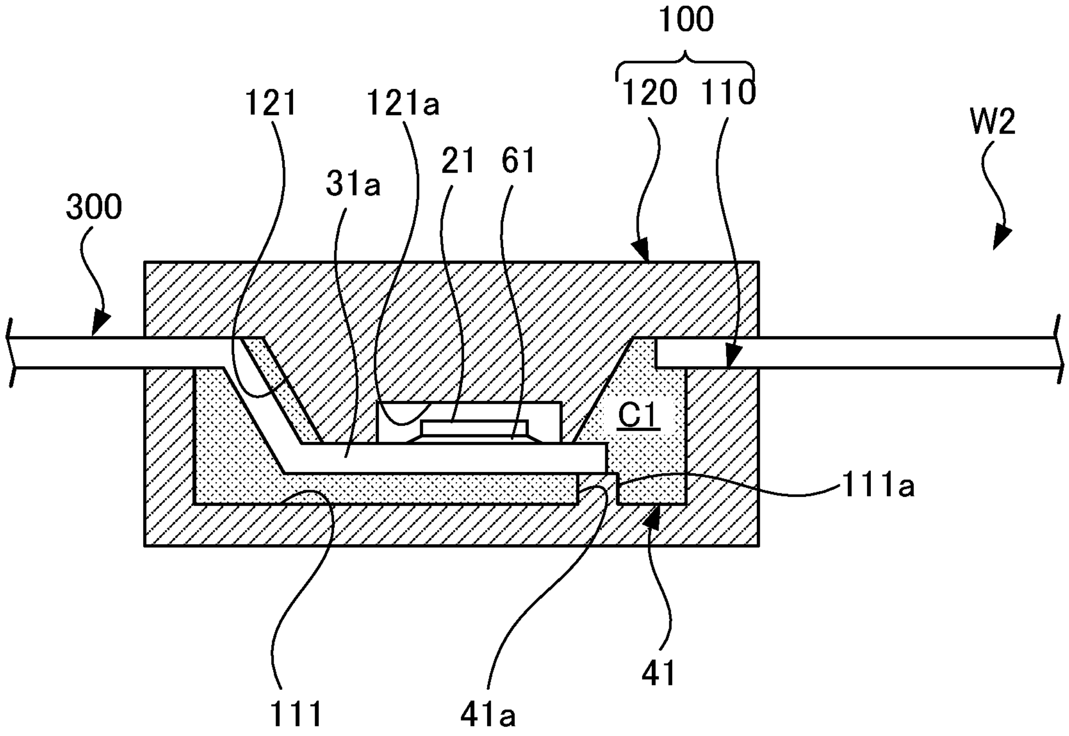
FIG. 11 is a diagram illustrating a first forming step.

FIG. 11 is a diagram illustrating the first forming step S2. At the first forming step S2, the first sealing portion 41 is formed as illustrated in FIG. 11. A workpiece W2 is thereby obtained.

More specifically, the first forming mold 100 is first prepared at the first forming step S2. The first forming mold 100 has a lower mold 110 and an upper mold 120 forming a cavity C1. The lower mold 110 has a forming face 111 forming the rear surface and the side surface of the first sealing portion 41. The protrusions 111*a* are provided on the forming face 111. Each of the protrusions 111*a* is a convex part for forming a notch part. The upper mold 120 has a forming face 121 forming the front surface of the first sealing portion 41.

Next, the workpiece W1 is placed on the forming face 111 of the lower mold 110. At that time, the protrusions 111*a* are brought into contact with the first faces F1 of the first die pads 31*a*. Accordingly, a gap corresponding to the height of the protrusions 111*a* is formed between the first die pads 31*a* and the forming face 111.

Subsequently, an uncured first resin composition is filled in the cavity C1 in a state in which the lower mold 110 and the upper mold 120 are closed. The first sealing portion 41 is formed by curing the first resin composition.

1-4-3. Second Chip Mounting Step

Figure 12:
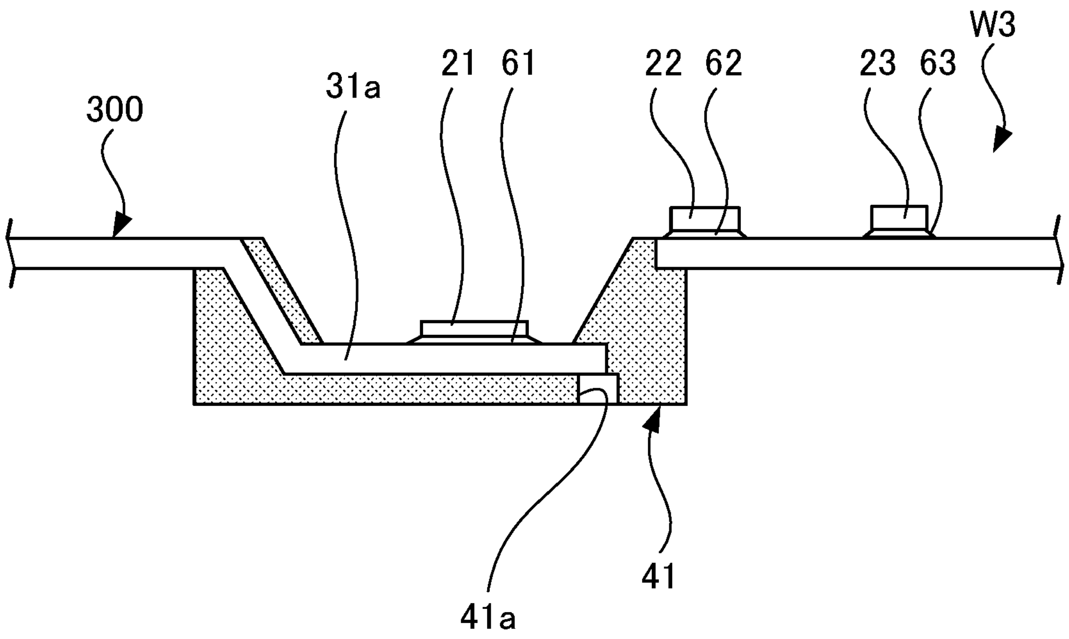
FIG. 12 is a diagram illustrating a second semiconductor chip mounting step.

FIG. 12 is a diagram illustrating the second chip mounting step S3. At the second chip mounting step S3, after the workpiece W2 is removed from the first forming mold 100, the second semiconductor chips 22 are respectively joined to the corresponding second die pads 32*a* with the joining material 62. In addition, the semiconductor chips 23 are respectively joined to the corresponding second die pads 32*a* with the joining material 63 as illustrated in FIG. 12. A workpiece W3 is thereby obtained.

1-4-4. Wire Bonding Step

Figure 13:
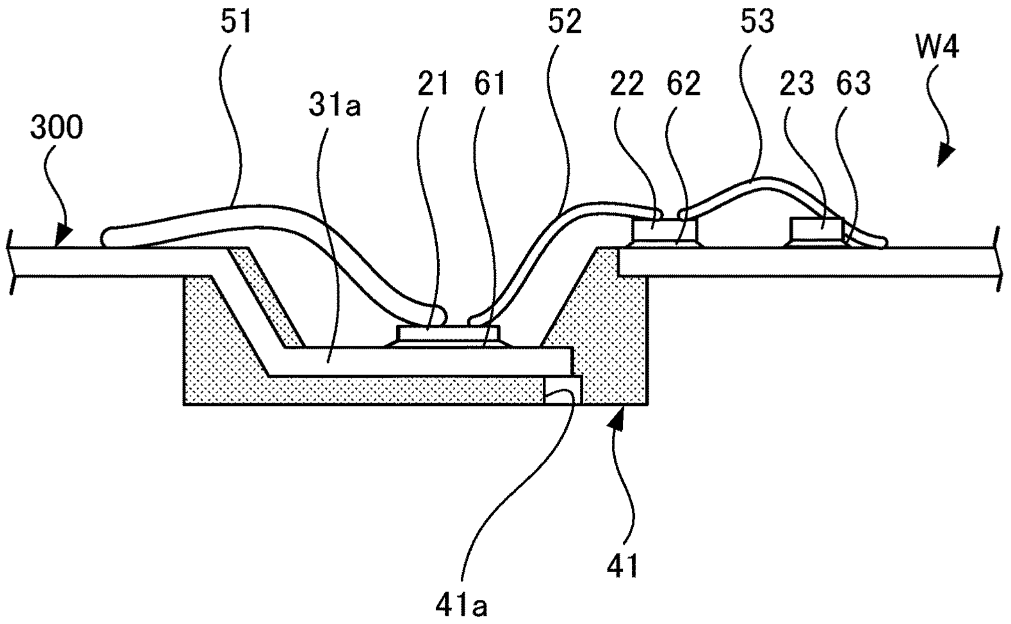
FIG. 13 is a diagram illustrating a wire bonding step.

FIG. 13 is a diagram illustrating the wire bonding step S4. At the wiring bonding step S4, bonding wires that appropriately connect the first semiconductor chips 21, the second semiconductor chips 22, the semiconductor chips 23, and the lead group 30 are formed as illustrated in FIG. 13. A workpiece W4 is thereby obtained.

1-4-5. Second Forming Step

Figure 14:
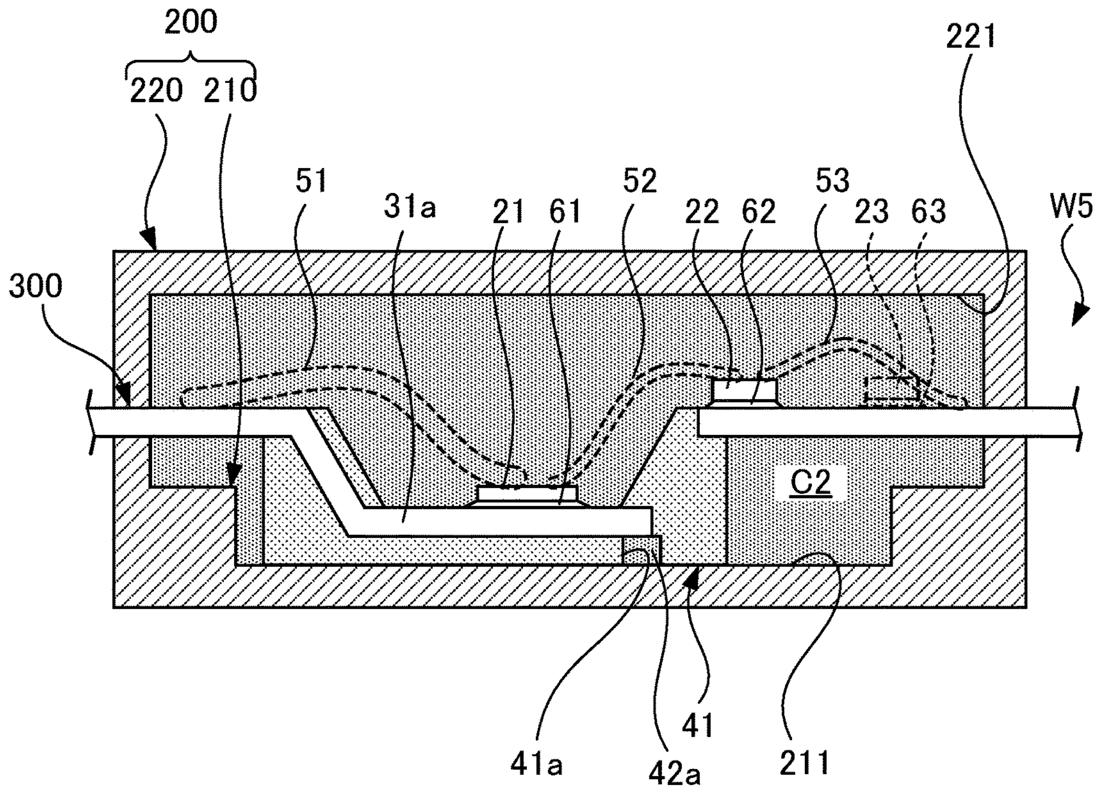
FIG. 14 is a diagram illustrating a second forming step.

FIG. 14 is a diagram illustrating the second forming step S5. At the second forming step S5, the second sealing portion 42 is formed as illustrated in FIG. 14. A workpiece W5 is thereby obtained.

More specifically, a second forming mold 200 is first prepared at the second forming step S5. The second forming mold 200 has a lower mold 210 and an upper mold 220 forming a cavity C2. The lower mold 210 has a forming face 211 forming the rear surface of the second sealing portion 42 and a part of the side surface thereof. The upper mold 220 has a forming face 221 forming the front surface of the second sealing portion 42 and the remaining part of the side surface thereof.

Next, the workpiece W4 is placed on the forming face 211 of the lower mold 210. Subsequently, an uncured second resin composition is filled in the cavity C2 formed between the lower mold 210 and the upper mold 220 in a state in which the lower mold 210 and the upper mold 220 are closed. The second sealing portion 42 is formed by curing the second resin composition.

1-4-6. Lead Processing Step

At the lead processing step S6, after the workpiece W5 is removed from the second forming mold 200, the tie bar of the lead frame 300 is cut to separate the lead group 30 from the lead frame 300. The first outer leads 31*b* and the second outer lead 32*b* are subsequently formed. With the steps described above, the semiconductor module 10 is obtained.

As described above, the semiconductor module 10 includes the first die pads 31*a*, the first outer leads 31*b*, the first inner leads 31*c*, the first semiconductor chips 21, and the sealing material 40. Each of the first die pads 31*a* has a first face F1, and a second face F2 directed in the direction opposite to the first face F1. First outer leads 31*b* are positioned in the direction in which a second face F2 is directed relative to the first die pads 31*a*. Each of the first inner leads 31*c* connects the corresponding first die pad 31*a* and the corresponding first outer lead 31*b* to each other and has the stepped portion 31*c*1. The first semiconductor chips 21 are joined to the corresponding second face F2. The sealing material 40 seals the first die pads 31*a* and the first semiconductor chips 21.

The sealing material 40 includes the first sealing portion 41 and the second sealing portion 42. The first sealing portion 41 is joined to the first faces F1 and is constituted of the first resin composition. The second sealing portion 42 is joined to the second faces F2 and is constituted of the second resin composition that is lower in thermal conductivity than the first resin composition.

In addition, the first sealing portion 41 has the exposed face FE constituting a part of the outer surface of the sealing material 40, the first joining face FS1 joined to the first die pads 31*a*, and the second joining face FS2 joined to the stepped portions 31*c*1 along the height direction of the stepped portions 31*c*1.

Since the first sealing portion 41 has the first joining face F Si and the second joining face FS2 in the semiconductor module 10 described above, heat from the first semiconductor chips 21 can be dispersed not only to the first sealing portion 41 via the first die pads 31*a* but also to the first sealing portion 41 via the stepped portions 31*c*1. Furthermore, since the first sealing portion 41 has the exposed face FE and the thermal conductivity of the first resin composition is greater than that of the second resin composition, heat from the first semiconductor chips 21 can be efficiently dispersed from the exposed face FE.

The sealing material 40 includes the second sealing portion 42 in addition to the first sealing portion 41. Even when the first resin composition is made of an expensive material, the cost can be reduced as compared to a case in which the sealing material 40 is constituted of only the first resin composition. Furthermore, forming the first sealing portion 41 and the second sealing portion 42 at different steps has an advantage that the accuracy in positioning of the first die pads 31*a* in the sealing material 40 is easily increased. Accordingly, the heat dissipation can be improved while the cost of the semiconductor module 10 is reduced.

As described above, the first joining face FS1 is joined to the side surfaces of the first die pads 31*a* and the first faces F1. As a result, heat of the first semiconductor chips 21 can be efficiently dispersed to the first sealing portion 41 as compared to a configuration in which the first joining face FS1 is joined to only either the first faces F1 or the side surfaces of the first die pads 31*a*.

As described above, the second face F2 has a part not joined to the first joining face FS1. Accordingly, the first semiconductor chips 21 can be mounted on this part.

The second joining face FS2 is joined to the stepped portions 31*c*1 entirely in the height direction of the stepped portions 31*c*1. As a result, heat from the first semiconductor chips 21 can be more efficiently dispersed to the first sealing portion 41 via the stepped portions 31*c*1, as compared to a configuration in which the second joining face FS2 is joined to the stepped portions 31*c*1 only at a part thereof in the height direction.

As described above, the second joining face FS2 is joined to the stepped portions 31*c*1 entirely in the circumferential direction of the stepped portions 31*c*1. Accordingly, heat from the first semiconductor chips 21 can be more efficiently dispersed to the first sealing portion 41 via the stepped portions 31*c*1 as compared to a configuration in which the second joining face FS2 is joined to the stepped portions 31*c*1 only at a part thereof in the circumferential direction.

Furthermore, the second joining face FS2 covers the entirety of the surfaces of the stepped portions 31*c*1. As a result, heat from the first semiconductor chips 21 can be more efficiently dispersed to the first sealing portion 41 via the stepped portions 31*c*1 as compared to a configuration in which the second joining face FS2 covers only a part of the surfaces of the stepped portions 31*c*1.

As described above, the semiconductor module 10 further includes the second die pads 32*a*, the second outer leads 32*b*, the second inner leads 32*c*, and the second semiconductor chips 22. The second die pads 32*a* are positioned in the direction in which the second face F2 is directed relative to the first die pads 31*a*. Each of the second inner leads 32*c* is configured integrally with the corresponding second die pad 32*a* and the corresponding second outer lead 32*b*. Each of the second semiconductor chips 22 is joined to the corresponding second die pad 32*a*. The first sealing portion 41 further has the third joining face FS3 joined to either or both of the second die pads 32*a* and the second inner leads 32*c*. Accordingly, positioning of the second die pads 32*a*, the second outer leads 32*b*, and the second inner leads 32*c* with respect to the first die pads 31*a* can be performed by the first sealing portion 41. Furthermore, heat from the first semiconductor chips 21 can be dispersed to the outside via the first die pads 31*a*, the first sealing portion 41, the second die pads 32*a* or the second inner leads 32*c*, and the second outer leads 32*b*.

Furthermore, the first sealing portion 41 has the notch part 41*a* extending from the exposed face FE to the first face F1. The second sealing portion 42 has the part 42*a* filled in the notch part 41*a*. As a result, the protrusions 111*a* for forming the notch part 41*a* are provided on the first forming mold 100 used at the time of formation of the first sealing portion 41, so that the first die pads 31*a* can be positioned by the protrusions 111*a*. Since the second sealing portion 42 has the part 42*a* to be filled in the notch part 41*a*, the mechanical strength of the sealing material 40 can be increased and the contact area between the exposed face FE and the radiating fin can be increased to improve the heat dissipation as compared to a configuration not including the part 42*a*.

As described above, the manufacturing method for the semiconductor module 10 includes the preparation step S0, the first forming step S2, and the second forming step S5. At the preparation step S0, the lead frame 300 including the first die pads 31*a*, the first outer leads 31*b*, and the first inner leads 31*c* is prepared. At the first forming step S2, the first sealing portion 41 to be joined to the first face F1 is formed as a part of the sealing material 40 using the first resin composition. At the second forming step S5, the second sealing portion 42 to be joined to the second face F2 is formed as another part of the sealing material 40 using the second resin composition lower in the thermal conductivity than the first resin composition.

By the manufacturing method described above, the first sealing portion 41 having the exposed face FE, the first joining face FS1, and the second joining face FS2 is obtained. As a result, the semiconductor module is obtained that can improve heat dissipation while reducing cost.

As described above, at the first forming step S2, the first sealing portion 41 is formed using the first forming mold 100. At the second forming step S5, the second sealing portion 42 is formed using the second forming mold 200 different from the first forming mold 100. Accordingly, the dimension accuracies of the first sealing portion 41 and the second sealing portion 42 can be enhanced. Furthermore, the first die pads 31*a* can be positioned by the protrusions 111*a* for forming the notch part 41*a* of the first forming mold 100. The flexibility in the lead layout can be enhanced by the second forming mold 200 not including positioning pins.

Specifically, the first forming mold 100 has the protrusions 111*a* that are brought into contact with the first face F1. At the first forming step S2, the notch part 41*a* extending from the exposed face FE to the first face F1 is formed on the first sealing portion 41 by the protrusions 111*a*. At the second forming step S5, the notch part 41*a* is filled with a part of the second sealing portion 42. As a result, the first die pads 31*a* can be positioned by the protrusions 111*a* of the first forming mold 100. Since the second forming mold 200 has a part for filling the second resin composition in the notch part 41*a*, the mechanical strength of the sealing material 40 can be enhanced and the contact area between the exposed face FE and the radiating member such as the radiating fin can be increased to improve the heat dissipation as compared to a configuration not including this part.

2. Second Embodiment

A second embodiment of this disclosure is explained below. In the embodiment exemplified below, elements substantially the same in action and function as the elements described in the embodiment described above are denoted by reference signs used in the explanations of the embodiment described above and explanations thereof are omitted as appropriate.

Figure 15:
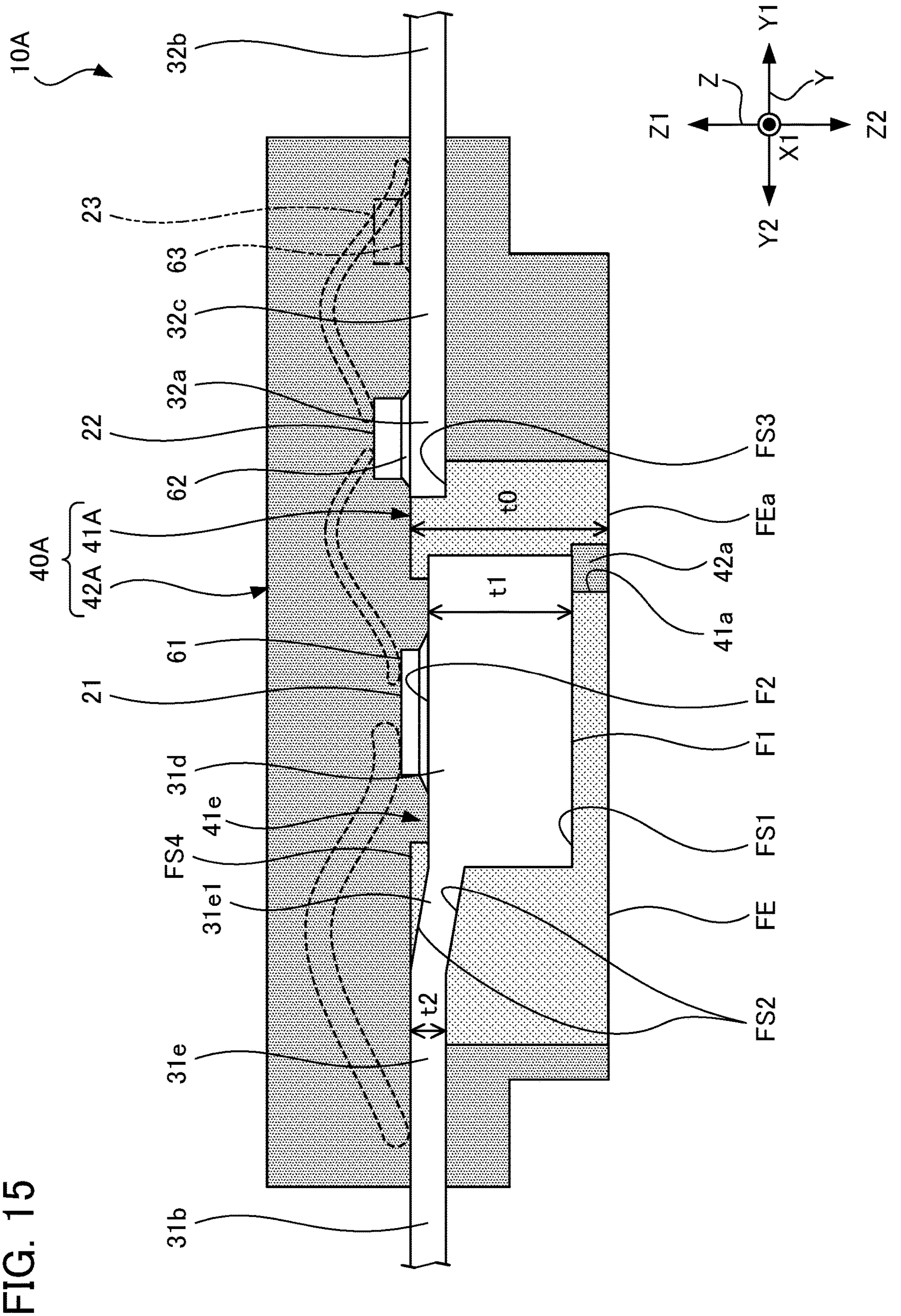
FIG. 15 is an enlarged sectional view of a semiconductor module according to a second embodiment.

FIG. 15 is an enlarged sectional view of a semiconductor module 10A according to the second embodiment. The semiconductor module 10A is configured in the same manner as the semiconductor module 10 of the first embodiment, except for including first die pads 31*d*, first inner leads 31*e*, stepped portions 31*e* 1, and a sealing material 40A, instead of the first die pads 31*a*, the first inner leads 31*c*, the stepped portions 31*c*1, and the sealing material 40 of the first embodiment.

Each of the first die pads 31*d* is configured in the same manner as the first die pads 31*a* of the first embodiment except for being different in the thickness, and has a plate shape having the first face F1 and the second face F2. Each of the first die pads 31*d* is connected to the corresponding first outer lead 31*b* via the corresponding first inner lead 31*e*.

The thickness t1 of the first die pads 31*d* is greater than the thickness t2 of the first inner leads 31*e*. The first die pads 31*d* protrude in a direction toward the exposed face FE with respect to the first inner leads 31*e*. Specifically, the second face F2 of each of the first die pads 31*d* is continuous with a face far from the exposed face FE out of the two faces of the corresponding first inner lead 31*e* in the thickness direction. In contrast, the first face F1 of each of the first die pads 31*d* is not continuous with a face near the exposed face FE out of the both faces of the corresponding first inner lead 31*e* in the thickness direction. The first face F1 is connected to the face near the exposed face FE via the side surface of the first die pad 31*d*.

With this protruding of the first die pads 31*d* relative to the first inner leads 31*e*, the first face F1 can be formed to be closer to the exposed face FE while the inclination angle of the stepped portions 31*e*1 described later is suppressed. As a result, effects such as improvement of the bondability to the first semiconductor chips 21 and enhancement of the transmission efficiency of heat from the first semiconductor chips 21 to the exposed face FE are obtained.

While it is sufficient for the thickness t1 of the first die pads 31*d* to be less than a thickness t0 of the first sealing portion 41A and to be greater than the thickness t2 of the first inner leads 31*e*, the thickness t1 is preferably equal to or greater than twice as large as the thickness t2 with the objective of enhancing the effects described above. More preferably, the thickness t1 is equal to or greater than twice of the thickness t2 and equal to or less than five times thereof with the objective of also achieving height reduction of the semiconductor module 10A.

The locations of the first die pads 31*d* and the first outer leads 31*b* in the directions along the Z-axis are different from each other in such a manner that the first die pads 31*d* are at locations nearer the exposed face FE. To allow this location relation between the first die pads 31*d* and the first outer leads 31*b*, each of the first inner leads 31*e* has the stepped portion 31*e*1.

The sealing material 40A has a first sealing portion 41A and a second sealing portion 42A. The first sealing portion 41A is configured in the same manner as the first sealing portion 41 of the first embodiment except for being different in shape. In association therewith, the second sealing portion 42A is configured in the same manner as the second sealing portion 42 of the first embodiment except for being different in shape.

The first sealing portion 41A has the exposed face FE constituting a part of the outer surface of the sealing material 40A, the first joining face FS1 joined to the first die pads 31*d*, the second joining face FS2 joined to the stepped portions 31*e*1 along the height direction of the stepped portions 31*e*1, and the third joining face FS3 joined to the second die pads 32*a*.

In this embodiment, the first joining face FS1 is joined to the side surfaces of the first die pads 31*d* and the first faces F1. Furthermore, the first sealing portion 41A includes a concave part 41*e* open in the Z1 direction. The second face F2 is exposed on the bottom part of the concave part 41*e*.

In this embodiment, the second joining face FS2 covers the entirety of the surfaces of the stepped portions 31*e* 1. An end face of the first sealing portion 41A directed in the direction opposite to the exposed face FE (i.e., an end face FS4 of the first sealing portion 41A in the Z1 direction) is positioned in the same plane as that of ends of the stepped portions 31$e$1 in the Z1 direction and is joined to the second sealing portion 42A. The end face FS4 has a part that overlaps the stepped portions 31$e$1 when viewed in the thickness direction of the first die pads 31$d$ and is parallel to the second face F2. Furthermore, the end face FS4 is positioned in the same plane as that of faces of the first inner leads 31$e$ directed in the Z1 direction. As a result, steps or concave parts formed on the surface of the first sealing portion 41A can be reduced. As a result, the formability of the first sealing portion 41A can be increased.

In the second embodiment, the heat dissipation and the cost reduction of the semiconductor module 10A can both be achieved. As described above, the first sealing portion 41A has the end face F S4 directed in the direction opposite to the exposed face FE. The end face FS4 has a part that overlaps the stepped portions 31$e$1 when viewed in the thickness direction of the first die pads 31$d$ and is parallel to the second face F2. As a result, the mechanical strength required for the first sealing portion 41A with respect to the stepped portions 31$e$1 can be provided while the formability of the first sealing portion 41A is enhanced.

As described above, the thickness t1 of the first die pads 31$d$ is greater than the thickness t2 of the first inner leads 31$e$. Heat may be broadly conducted on the first die pads 31$d$ as compared to a configuration in which the thickness t1 is equal to the thickness t2 as in the first embodiment. As a result, the heat can be efficiently dispersed from the semiconductor module 10A. Furthermore, the heat capacity of the first die pads 31$d$ can be increased as compared to the configuration in which the thickness t1 is equal to the thickness t2 as in the first embodiment. As a result, temperature changes in the first semiconductor chips 21 are decreased and transient response characteristics of the semiconductor module 10A can therefore be improved.

3. Modifications

This disclosure is not limited to the embodiments described above and various modifications as described below may be made. Furthermore, each of the embodiments and the modifications may be combined with one another as appropriate.

3-1. First Modification

In the foregoing embodiments, the end face of the first sealing portion 41 in the Z1 direction is located in the same planes as those of (i) the ends of the stepped portions 31$c$1 in the Z1 direction and (ii) the faces of the second inner leads 32$c$ directed in the Z1 direction is illustrated. However, such a configuration is not limited thereto. The end face of the first sealing portion 41 in the Z1 direction may be displaced in the Z1 direction or the Z2 direction with respect to the ends of the stepped portions 31$c$1 in the Z1 direction, or it may be displaced in the Z1 direction or the Z2 direction relative to the faces of the second inner leads 32$c$ directed in the Z1 direction.

3-2. Second Modification

Aspects such as the shape of the lead group 30 in plan view and the number of leads constituting the lead group 30 can be appropriately changed based on characteristics required for a semiconductor module and are not limited to those described above.

3-3. Third Modification

In the foregoing aspects, the side surface of the first sealing portion 41 is entirely covered by the second sealing portion 42. However, such a configuration is not limited thereto. At least a part of the side surface of the first sealing portion 41 may constitute a part of the outer surface of the sealing material 40 without being covered by the second sealing portion 42.

DESCRIPTION OF REFERENCE SIGNS

10 . . . semiconductor module, 21 . . . first semiconductor chip, 22 . . . second semiconductor chip, 23 . . . semiconductor chip, 30 . . . lead group, 31 . . . first lead group, 31$a$ . . . first die pad, 31$b$ . . . first outer lead, 31$c$ . . . first inner lead, 31$c$1 . . . stepped portion, 31$d$ . . . first die pad, 31$e$ . . . first inner lead, 31$e$1 . . . stepped portion, 32 . . . second lead group, 32$a$ . . . second die pad, 32$b$ . . . second outer lead, 32$c$ . . . second inner lead, 40 . . . sealing material, sealing material, 41 . . . first sealing portion, 41A . . . first sealing portion, 41$a$ . . . notch part, 41$b$ . . . wall, 41$c$ . . . wall, 41$d$ . . . concave part, 41$e$ . . . concave part, 42 . . . second sealing portion, 42A . . . second sealing portion 42$a$ . . . part, 51 . . . bonding wire, 52 . . . bonding wire, 53 . . . bonding wire, 54 . . . bonding wire, 61 . . . joining material, 62 . . . joining material, 63 . . . joining material, 100 . . . first forming mold, 110 . . . lower mold, 111 . . . forming face, 111$a$ . . . protrusion, 120 . . . upper mold, 121 . . . forming face, 200 . . . second forming mold, 210 . . . lower mold, 211 . . . forming face, 220 . . . upper mold, 221 . . . forming face, 300 . . . lead frame, C1 . . . cavity, C2 . . . cavity, CB . . . power supply capacitor, COM . . . common terminal, EFa . . . part, F1 . . . first face, F2 . . . second face, FE . . . exposed face, FEa . . . part, FS1 . . . first joining face, FS2 . . . second joining face, FS3 . . . third joining face, F S4 . . . end face, IS . . . current detection terminal, M . . . motor, N . . . negative DC terminal, P . . . positive DC terminal, Rdet . . . current detecting resistor, S0 . . . preparation step, Si . . . first chip mounting step, S2 . . . first forming step, S3 . . . second chip mounting step, S4 . . . wire bonding step, S5 . . . second forming step, S6 . . . lead processing step, U . . . output terminal, UINH . . . signal input terminal, UINL . . . signal input terminal, UOUT . . . output terminal, V . . . output terminal, VBU . . . gate power terminal, VBV . . . gate power terminal, VBW . . . gate power terminal, VCC . . . signal power source, VCCH . . . signal power terminal, VCCL . . . signal power terminal, VDC . . . DC power source, VINH . . . signal input terminal, VINL . . . signal input terminal, VOUT . . . output terminal, VS2U . . . reference potential terminal, VS2V . . . reference potential terminal, VS2W . . . reference potential terminal, Vcc . . . signal power source, W . . . output terminal, W1 . . . work, W2 . . . work, W3 . . . work, W4 . . . work, W5 . . . work, WINH . . . signal input terminal, WINL . . . signal input terminal, WOUT . . . output terminal.

What is claimed is:

1. A semiconductor module comprising:

a first die pad having a first face, and a second face directed in a direction opposite to the first face;

a first outer lead positioned in the direction in which the second face of the first die pad is directed relative to the first die pad;

a first inner lead connecting the first die pad and the first outer lead to each other and having a stepped portion that is inclined in a cross section of the first inner lead;

a first semiconductor chip joined to the second face of the first die pad;

a second die pad positioned, relative to the first die pad, in the direction in which the second face of the first die pad faces, the second die pad having a first face and a second face opposite the first face;

a second outer lead;

a second inner lead integral with the second die pad and the second outer lead;

a second semiconductor chip, joined to the second face of the second die pad; and a sealing material that seals the first die pad, the first semiconductor chip, the second die pad, and the second semiconductor chip, wherein the sealing material includes:

a first sealing portion joined to the first face of the first die pad and constituted of a first resin composition, the first sealing portion having:

an exposed face constituting a part of an outer surface of the sealing material, a first joining face joined to the first die pad, a second joining face joined to the stepped portion along a height direction of the stepped portion, and a third joining face joined to the second die pad, a second sealing portion joined to the second face of the first die pad and constituted of a second resin composition lower in thermal conductivity than the first resin composition, and at least a portion of the first inner lead, excluding the stepped portion, is included within the second sealing portion.

2. The semiconductor module according to claim 1, wherein the first joining face is joined to a side surface of the first die pad and the first face of the first die pad.

3. The semiconductor module according to claim 2, wherein the second face of the first die pad has a part that is not joined to the first joining face.

4. The semiconductor module according to claim 1, wherein the second joining face is joined to the stepped portion entirely in a height direction of the stepped portion.

5. The semiconductor module according to claim 1, wherein the second joining face is joined to the stepped portion entirely in a circumferential direction of the stepped portion.

6. The semiconductor module according to claim 5, wherein the second joining face covers an entirety of a surface of the stepped portion.

7. The semiconductor module according to claim 5, wherein:

the first sealing portion has an end face directed in a direction opposite to the exposed face, and the end face has a part overlapping with the stepped portion when viewed in a thickness direction of the first die pad and being parallel to the second face.

8. The semiconductor module according to claim 1, wherein a thickness of the first die pad is greater than a thickness of the first inner lead.

9. The semiconductor module according to claim 1, wherein:

the first sealing portion has a notch part extending from the exposed face to the first face of the first die pad, and the second sealing portion has a part filled in the notch part.

10. The semiconductor module according to claim 1, wherein a thickness of the first inner lead differs from a thickness of the first die pad.

11. The semiconductor module according to claim 1, wherein a thickness of the first die pad is greater than twice a thickness of the first inner lead.

12. A manufacturing method of a semiconductor module including:

a first die pad having a first face, and a second face directed in a direction opposite to the first face, a first outer lead positioned in a direction in which the second face of the first die pad is directed, a first inner lead connecting the first die pad and the first outer lead to each other and having a stepped portion that is inclined in a cross section of the first inner lead, a first semiconductor chip joined to the second face of the first die pad, a second die pad positioned, relative to the first die pad, in the direction in which the second face of the first die pad faces, and having a first face and a second face opposite the first face, a second outer lead, a second inner lead integral with the second die pad and the second outer lead, a second semiconductor chip, joined to the second face of the second die pad, and a sealing material sealing the first die pad, the first semiconductor chip, the second die pad, and the second semiconductor chip, the manufacturing method comprising:

joining, to the first face of the first die pad, a first sealing portion of the sealing material including a first resin composition such that an exposed face constituting a part of an outer surface of the sealing material is formed, a first joining face joined to the first die pad is formed, a second joining face joined to the stepped portion along a height direction of the stepped portion is formed, and a third joining face joined to the second die pad is formed; and joining, to the second face of the first die pad, a second sealing portion of the sealing material including a second resin composition lower in thermal conductivity than the first resin composition such that at least a portion of the first inner lead that excludes the stepped portion is included within the second sealing portion.

13. The manufacturing method according to claim 12, wherein:

the joining, to the first face of the first die pad, includes joining the first sealing portion with a first forming mold, and the joining, to the second face of the first die pad, includes joining the second sealing portion with a second forming mold different from the first forming mold.

14. The manufacturing method according to claim 13, wherein:

the first forming mold has protrusions to be brought into contact with the first face, the joining, to the first face of the first die pad, includes forming a notch part extending from the exposed face to the first face of the first die pad on the first sealing portion by the protrusions, and the joining, to the second face of the first die pad, includes filling the notch part with a part of the second sealing portion.

15. A semiconductor module comprising:

a first die pad having a first face, and a second face directed in a direction opposite to the first face;

a first outer lead positioned in the direction in which the second face is directed relative to the first die pad;

a first inner lead connecting the first die pad and the first outer lead to each other and having a stepped portion that is inclined in a cross section of the first inner lead;

a first semiconductor chip joined to the second face; and a sealing material sealing the first die pad and the first semiconductor chip, wherein the sealing material includes:

a first sealing portion joined to the first face and constituted of a first resin composition, the first sealing portion having:

an exposed face constituting a part of an outer surface of the sealing material, a first joining face joined to the first die pad, a second joining face joined to the stepped portion along a height direction of the stepped portion, and an end face directed in a direction opposite to the exposed face, the end face having a part that overlaps with the stepped portion when viewed in a thickness direction of the first die pad and that is parallel to the second face, and a second sealing portion joined to the second face and constituted of a second resin composition lower in thermal conductivity than the first resin composition, and at least a portion of the first inner lead, excluding the stepped portion, is included within the second sealing portion.

* * * * *